(12) United States Patent
Kato et al.

(10) Patent No.: US 8,602,310 B2
(45) Date of Patent: Dec. 10, 2013

(54) RADIO COMMUNICATION DEVICE AND RADIO COMMUNICATION TERMINAL

(75) Inventors: Noboru Kato, Nagaokakyo (JP); Hiromi Murayama, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/600,256

(22) Filed: Aug. 31, 2012

(65) Prior Publication Data

US 2012/0325915 A1 Dec. 27, 2012

Related U.S. Application Data

(63) Continuation of application No. PCT/JP2011/052596, filed on Feb. 8, 2011.

(30) Foreign Application Priority Data

Mar. 3, 2010 (JP) .................................. 2010-046539

(51) Int. Cl.
*G06K 19/06* (2006.01)

(52) U.S. Cl.
USPC .......................................... 235/487; 235/492

(58) Field of Classification Search
USPC ................................. 235/487, 492
See application file for complete search history.

(56) References Cited

U.S. PATENT DOCUMENTS

| | | |
|---|---|---|
| 3,364,564 A | 1/1968 | Kurtz et al. |
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,528,222 A | 6/1996 | Moskowitz et al. |
| 5,757,074 A | 5/1998 | Matloubian et al. |

(Continued)

FOREIGN PATENT DOCUMENTS

| | | |
|---|---|---|
| CA | 2 279 176 A1 | 7/1998 |
| DE | 10 2006 057 369 A1 | 6/2008 |

(Continued)

OTHER PUBLICATIONS

Official communication issued in Japanese Application No. 2007-531524, mailed on Sep. 11, 2007.

(Continued)

*Primary Examiner* — Karl D Frech
(74) *Attorney, Agent, or Firm* — Keating & Bennett, LLP

(57) ABSTRACT

A radio communication device includes a radio frequency IC chip configured to process a radio signal, a feeding circuit board that is coupled to the radio frequency IC chip and includes a loop electrode including coil patterns having a predetermined winding width, and an antenna pattern that is magnetically coupled to the loop electrode. The feeding circuit board is arranged so that, in plan view, a first region of the loop electrode in which the coil patterns extend in a first direction overlaps the antenna pattern and a second region of the loop electrode in which the coil patterns extend in a second direction opposite to the first direction do not overlap the antenna pattern. The first direction and a line length direction of the antenna pattern are the same or substantially the same.

20 Claims, 13 Drawing Sheets

(56) References Cited

U.S. PATENT DOCUMENTS

| | | |
|---|---|---|
| 5,854,480 A | 12/1998 | Noto |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,104,611 A | 8/2000 | Glover et al. |
| 6,107,920 A | 8/2000 | Eberhardt et al. |
| 6,172,608 B1 | 1/2001 | Cole |
| 6,181,287 B1 | 1/2001 | Beigel |
| 6,190,942 B1 | 2/2001 | Wilm et al. |
| 6,243,045 B1 | 6/2001 | Ishibashi |
| 6,249,258 B1 | 6/2001 | Bloch et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,452,563 B1 | 9/2002 | Porte |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,861,731 B2 | 3/2005 | Buijsman et al. |
| 6,927,738 B2 | 8/2005 | Senba et al. |
| 6,956,481 B1 | 10/2005 | Cole |
| 6,963,729 B2 | 11/2005 | Uozumi |
| 7,044,388 B2 * | 5/2006 | Kamiya et al. ............... 235/492 |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 2001/0011012 A1 | 8/2001 | Hino et al. |
| 2002/0011967 A1 | 1/2002 | Goff et al. |
| 2002/0015002 A1 | 2/2002 | Yasukawa et al. |
| 2002/0044092 A1 | 4/2002 | Kushihi |
| 2002/0067316 A1 | 6/2002 | Yokoshima et al. |
| 2002/0093457 A1 | 7/2002 | Hamada et al. |
| 2003/0006901 A1 | 1/2003 | Kim et al. |
| 2003/0020661 A1 | 1/2003 | Sato |
| 2003/0045324 A1 | 3/2003 | Nagumo et al. |
| 2003/0169153 A1 | 9/2003 | Muller |
| 2004/0001027 A1 | 1/2004 | Killen et al. |
| 2004/0026519 A1 | 2/2004 | Usami et al. |
| 2004/0056823 A1 | 3/2004 | Zuk et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2004/0252064 A1 | 12/2004 | Yuanzhu |
| 2005/0001031 A1 | 1/2005 | Akiho et al. |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0134460 A1 | 6/2005 | Usami |
| 2005/0134506 A1 | 6/2005 | Egbert |
| 2005/0138798 A1 | 6/2005 | Sakama et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0275539 A1 | 12/2005 | Sakama et al. |
| 2006/0001138 A1 | 1/2006 | Sakama et al. |
| 2006/0032926 A1 | 2/2006 | Baba et al. |
| 2006/0044192 A1 | 3/2006 | Egbert |
| 2006/0055531 A1 | 3/2006 | Cook et al. |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0214801 A1 | 9/2006 | Murofushi et al. |
| 2006/0220871 A1 | 10/2006 | Baba et al. |
| 2006/0244568 A1 | 11/2006 | Tong et al. |
| 2006/0244676 A1 | 11/2006 | Uesaka |
| 2006/0267138 A1 | 11/2006 | Kobayashi |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0057854 A1 | 3/2007 | Oodachi et al. |
| 2007/0069037 A1 | 3/2007 | Kawai |
| 2007/0132591 A1 | 6/2007 | Khatri |
| 2007/0164414 A1 | 7/2007 | Dokai et al. |
| 2007/0200782 A1 | 8/2007 | Hayama et al. |
| 2007/0229276 A1 | 10/2007 | Yamagajo et al. |
| 2007/0247387 A1 | 10/2007 | Kubo et al. |
| 2007/0252700 A1 | 11/2007 | Ishihara et al. |
| 2007/0252703 A1 | 11/2007 | Kato et al. |
| 2007/0252763 A1 | 11/2007 | Martin |
| 2007/0285335 A1 | 12/2007 | Bungo et al. |
| 2007/0290928 A1 | 12/2007 | Chang et al. |
| 2008/0024156 A1 | 1/2008 | Arai et al. |
| 2008/0068132 A1 | 3/2008 | Kayanakis et al. |
| 2008/0070003 A1 | 3/2008 | Nakatani et al. |
| 2008/0087990 A1 | 4/2008 | Kato et al. |
| 2008/0143630 A1 | 6/2008 | Kato et al. |
| 2008/0169905 A1 | 7/2008 | Slatter |
| 2008/0184281 A1 | 7/2008 | Ashizaki et al. |
| 2008/0272885 A1 | 11/2008 | Atherton |
| 2009/0002130 A1 | 1/2009 | Kato |
| 2009/0009007 A1 | 1/2009 | Kato et al. |
| 2009/0021352 A1 | 1/2009 | Kataya et al. |
| 2009/0021446 A1 | 1/2009 | Kataya et al. |
| 2009/0065594 A1 | 3/2009 | Kato et al. |
| 2009/0109102 A1 | 4/2009 | Dokai et al. |
| 2009/0160719 A1 | 6/2009 | Kato et al. |
| 2009/0201116 A1 | 8/2009 | Orihara |
| 2009/0224061 A1 | 9/2009 | Kato et al. |
| 2009/0231106 A1 | 9/2009 | Okamura |
| 2009/0262041 A1 | 10/2009 | Ikemoto et al. |
| 2009/0266900 A1 | 10/2009 | Ikemoto et al. |
| 2009/0278687 A1 | 11/2009 | Kato |
| 2009/0321527 A1 | 12/2009 | Kato et al. |
| 2010/0103058 A1 | 4/2010 | Kato et al. |
| 2010/0182210 A1 | 7/2010 | Ryou et al. |
| 2010/0308118 A1 | 12/2010 | Kataya et al. |
| 2011/0031320 A1 | 2/2011 | Kato et al. |
| 2011/0063184 A1 | 3/2011 | Furumura et al. |

FOREIGN PATENT DOCUMENTS

| | | |
|---|---|---|
| EP | 0 694 874 A2 | 1/1996 |
| EP | 0 848 448 A2 | 6/1998 |
| EP | 0 948 083 A2 | 10/1999 |
| EP | 0 977 145 A2 | 2/2000 |
| EP | 1 010 543 A1 | 6/2000 |
| EP | 1 085 480 A1 | 3/2001 |
| EP | 1 160 915 A2 | 12/2001 |
| EP | 1 170 795 A2 | 1/2002 |
| EP | 1 193 793 A2 | 4/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 547 753 A1 | 6/2005 |
| EP | 1 548 872 A1 | 6/2005 |
| EP | 1 626 364 A2 | 2/2006 |
| EP | 1 701 296 A1 | 9/2006 |
| EP | 1 703 589 A1 | 9/2006 |

(56) References Cited

FOREIGN PATENT DOCUMENTS

| | | |
|---|---|---|
| EP | 1 742 296 A1 | 1/2007 |
| EP | 1 744 398 A1 | 1/2007 |
| EP | 1 840 802 A1 | 10/2007 |
| EP | 1 841 005 A1 | 10/2007 |
| EP | 1 865 574 A1 | 12/2007 |
| EP | 1 887 652 A1 | 2/2008 |
| EP | 1 976 056 A1 | 10/2008 |
| EP | 1 988 491 A1 | 11/2008 |
| EP | 1 988 601 A1 | 11/2008 |
| EP | 1 993 170 A1 | 11/2008 |
| EP | 2 009 738 A1 | 12/2008 |
| EP | 2 012 258 A1 | 1/2009 |
| EP | 2 096 709 A1 | 9/2009 |
| EP | 2 148 449 A1 | 1/2010 |
| EP | 2 166 617 A1 | 3/2010 |
| EP | 2 251 934 A1 | 11/2010 |
| EP | 2 256 861 A1 | 12/2010 |
| EP | 2 330 684 A1 | 6/2011 |
| GB | 2 305 075 A | 3/1997 |
| GB | 2461443 A | 1/2010 |
| JP | 50-143451 A | 11/1975 |
| JP | 61-284102 A | 12/1986 |
| JP | 62-127140 U | 8/1987 |
| JP | 01-212035 A | 8/1989 |
| JP | 02-164105 A | 6/1990 |
| JP | 02-256208 A | 10/1990 |
| JP | 3-171385 A | 7/1991 |
| JP | 03-503467 A | 8/1991 |
| JP | 03-262313 A | 11/1991 |
| JP | 04-150011 A | 5/1992 |
| JP | 04-167500 A | 6/1992 |
| JP | 04-096814 U | 8/1992 |
| JP | 04-101168 U | 9/1992 |
| JP | 04-134807 U | 12/1992 |
| JP | 05-226926 A | 9/1993 |
| JP | 05-327331 A | 12/1993 |
| JP | 6-53733 A | 2/1994 |
| JP | 06-077729 A | 3/1994 |
| JP | 06-029215 U | 4/1994 |
| JP | 06-177635 A | 6/1994 |
| JP | 6-260949 A | 9/1994 |
| JP | 07-183836 A | 7/1995 |
| JP | 08-055725 A | 2/1996 |
| JP | 08-056113 A | 2/1996 |
| JP | 8-87580 A | 4/1996 |
| JP | 08-088586 A | 4/1996 |
| JP | 08-88586 A | 4/1996 |
| JP | 08-176421 A | 7/1996 |
| JP | 08-180160 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-035025 A | 2/1997 |
| JP | 09-093029 A | 4/1997 |
| JP | 9-93029 A | 4/1997 |
| JP | 09-245381 A | 9/1997 |
| JP | 09-252217 A | 9/1997 |
| JP | 09-270623 A | 10/1997 |
| JP | 09-284038 A | 10/1997 |
| JP | 9-512367 A | 12/1997 |
| JP | 10-69533 A | 3/1998 |
| JP | 10-069533 A | 3/1998 |
| JP | 10-505466 A | 5/1998 |
| JP | 10-171954 A | 6/1998 |
| JP | 10-173427 A | 6/1998 |
| JP | 10-193849 A | 7/1998 |
| JP | 10-193851 A | 7/1998 |
| JP | 10-242742 A | 9/1998 |
| JP | 10-293828 A | 11/1998 |
| JP | 10-334203 A | 12/1998 |
| JP | 11-025244 A | 1/1999 |
| JP | 11-039441 A | 2/1999 |
| JP | 11-075329 A | 3/1999 |
| JP | 11-085937 A | 3/1999 |
| JP | 11-88241 A | 3/1999 |
| JP | 11-102424 A | 4/1999 |
| JP | 11-103209 A | 4/1999 |
| JP | 11-149536 A | 6/1999 |
| JP | 11-149537 A | 6/1999 |
| JP | 11-149538 A | 6/1999 |
| JP | 11-175678 A | 7/1999 |
| JP | 11-219420 A | 8/1999 |
| JP | 11-220319 A | 8/1999 |
| JP | 11-282993 A | 10/1999 |
| JP | 11-328352 A | 11/1999 |
| JP | 11-331014 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2000-059260 A | 2/2000 |
| JP | 2000-085283 A | 3/2000 |
| JP | 2000-090207 A | 3/2000 |
| JP | 2000-132643 A | 5/2000 |
| JP | 2000-137778 A | 5/2000 |
| JP | 2000-137779 A | 5/2000 |
| JP | 2000-137785 A | 5/2000 |
| JP | 2000-148948 A | 5/2000 |
| JP | 2000-172812 A | 6/2000 |
| JP | 2000-209013 A | 7/2000 |
| JP | 2000-222540 A | 8/2000 |
| JP | 2000-510271 A | 8/2000 |
| JP | 2000-242754 A | 9/2000 |
| JP | 2000-243797 A | 9/2000 |
| JP | 2000-251049 A | 9/2000 |
| JP | 2000-261230 A | 9/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 2000-349680 A | 12/2000 |
| JP | 2001-10264 A | 1/2001 |
| JP | 2001-028036 A | 1/2001 |
| JP | 2001-043340 A | 2/2001 |
| JP | 3075400 U | 2/2001 |
| JP | 2001-66990 A | 3/2001 |
| JP | 2001-76111 A | 3/2001 |
| JP | 2001-084463 A | 3/2001 |
| JP | 2001-101369 A | 4/2001 |
| JP | 2001-505682 A | 4/2001 |
| JP | 2001-168628 A | 6/2001 |
| JP | 2001-188890 A | 7/2001 |
| JP | 2001-209767 A | 8/2001 |
| JP | 2001-240046 A | 9/2001 |
| JP | 2001-240217 A | 9/2001 |
| JP | 2001-256457 A | 9/2001 |
| JP | 2001-257292 A | 9/2001 |
| JP | 2001-514777 A | 9/2001 |
| JP | 2001-291181 A | 10/2001 |
| JP | 2001-319380 A | 11/2001 |
| JP | 2001-331976 A | 11/2001 |
| JP | 2001-332923 A | 11/2001 |
| JP | 2001-339226 A | 12/2001 |
| JP | 2001-344574 A | 12/2001 |
| JP | 2001-351083 A | 12/2001 |
| JP | 2001-351084 A | 12/2001 |
| JP | 2001-352176 A | 12/2001 |
| JP | 2001-358527 A | 12/2001 |
| JP | 2002-024776 A | 1/2002 |
| JP | 2002-026513 A | 1/2002 |
| JP | 2002-32731 A | 1/2002 |
| JP | 2002-042076 A | 2/2002 |
| JP | 2002-042083 A | 2/2002 |
| JP | 2002-063557 A | 2/2002 |
| JP | 2002-505645 A | 2/2002 |
| JP | 2002-076750 A | 3/2002 |
| JP | 2002-76750 A | 3/2002 |
| JP | 2002-111363 A | 4/2002 |
| JP | 2002-150245 A | 5/2002 |
| JP | 2002-157564 A | 5/2002 |
| JP | 2002-158529 A | 5/2002 |

(56) References Cited

FOREIGN PATENT DOCUMENTS

| | | |
|---|---|---|
| JP | 2002-175508 A | 6/2002 |
| JP | 2002-183676 A | 6/2002 |
| JP | 2002-183690 A | 6/2002 |
| JP | 2002-185358 A | 6/2002 |
| JP | 2002-204117 A | 7/2002 |
| JP | 2002-521757 A | 7/2002 |
| JP | 2002-522849 A | 7/2002 |
| JP | 2002-230128 A | 8/2002 |
| JP | 2002-232221 A | 8/2002 |
| JP | 2002-246828 A | 8/2002 |
| JP | 2002-252117 A | 9/2002 |
| JP | 2002-259934 A | 9/2002 |
| JP | 2002-280821 A | 9/2002 |
| JP | 2002-298109 A | 10/2002 |
| JP | 2002-308437 A | 10/2002 |
| JP | 2002-319008 A | 10/2002 |
| JP | 2002-319009 A | 10/2002 |
| JP | 2002-319812 A | 10/2002 |
| JP | 2002-362613 A | 12/2002 |
| JP | 2002-366917 A | 12/2002 |
| JP | 2002-373029 A | 12/2002 |
| JP | 2002-373323 A | 12/2002 |
| JP | 2002-374139 A | 12/2002 |
| JP | 2003-006599 A | 1/2003 |
| JP | 2003-016412 A | 1/2003 |
| JP | 2003-022912 A | 1/2003 |
| JP | 2003-026177 A | 1/2003 |
| JP | 2003-030612 A | 1/2003 |
| JP | 2003-037861 A | 2/2003 |
| JP | 2003-44789 A | 2/2003 |
| JP | 2003-046318 A | 2/2003 |
| JP | 2003-58840 A | 2/2003 |
| JP | 2003-067711 A | 3/2003 |
| JP | 2003-069335 A | 3/2003 |
| JP | 2003-076947 A | 3/2003 |
| JP | 2003-76963 A | 3/2003 |
| JP | 2003-78333 A | 3/2003 |
| JP | 2003-078336 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099184 A | 4/2003 |
| JP | 2003-099720 A | 4/2003 |
| JP | 2003-099721 A | 4/2003 |
| JP | 2003-110344 A | 4/2003 |
| JP | 2003-132330 A | 5/2003 |
| JP | 2003-134007 A | 5/2003 |
| JP | 2003-155062 A | 5/2003 |
| JP | 2003-158414 A | 5/2003 |
| JP | 2003-168760 A | 6/2003 |
| JP | 2003-179565 A | 6/2003 |
| JP | 2003-187207 A | 7/2003 |
| JP | 2003-187211 A | 7/2003 |
| JP | 2003-188338 A | 7/2003 |
| JP | 2003-188620 A | 7/2003 |
| JP | 2003-198230 A | 7/2003 |
| JP | 2003-209421 A | 7/2003 |
| JP | 2003-216919 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-249813 A | 9/2003 |
| JP | 2003-529163 A | 9/2003 |
| JP | 2003-288560 A | 10/2003 |
| JP | 2003-309418 A | 10/2003 |
| JP | 2003-317060 A | 11/2003 |
| JP | 2003-331246 A | 11/2003 |
| JP | 2003-332820 A | 11/2003 |
| JP | 2003-536302 A | 12/2003 |
| JP | 2004-040597 A | 2/2004 |
| JP | 2004-505481 A | 2/2004 |
| JP | 2004-082775 A | 3/2004 |
| JP | 2004-88218 A | 3/2004 |
| JP | 2004-93693 A | 3/2004 |
| JP | 2004-096566 A | 3/2004 |
| JP | 2004-096618 A | 3/2004 |
| JP | 2004-126750 A | 4/2004 |
| JP | 2004-127230 A | 4/2004 |
| JP | 2004-140513 A | 5/2004 |
| JP | 2004-163134 A | 6/2004 |
| JP | 2004-213582 A | 7/2004 |
| JP | 2004-519916 A | 7/2004 |
| JP | 2004-234595 A | 8/2004 |
| JP | 2004-253858 A | 9/2004 |
| JP | 2004-527864 A | 9/2004 |
| JP | 2004-280390 A | 10/2004 |
| JP | 2004-282403 A | 10/2004 |
| JP | 2004-287767 A | 10/2004 |
| JP | 2004-295297 A | 10/2004 |
| JP | 2004-297249 A | 10/2004 |
| JP | 2004-297681 A | 10/2004 |
| JP | 2004-304370 A | 10/2004 |
| JP | 2004-319848 A | 11/2004 |
| JP | 2004-326380 A | 11/2004 |
| JP | 2004-334268 A | 11/2004 |
| JP | 2004-336250 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-5866 A | 1/2005 |
| JP | 2005-18156 A | 1/2005 |
| JP | 2005-033461 A | 2/2005 |
| JP | 2005-064799 A | 3/2005 |
| JP | 2005-124061 A | 5/2005 |
| JP | 2005-128592 A | 5/2005 |
| JP | 2005-129019 A | 5/2005 |
| JP | 2005-135132 A | 5/2005 |
| JP | 2005-136528 A | 5/2005 |
| JP | 2005-137032 A | 5/2005 |
| JP | 3653099 B2 | 5/2005 |
| JP | 2005-165839 A | 6/2005 |
| JP | 2005-167327 A | 6/2005 |
| JP | 2005-167813 A | 6/2005 |
| JP | 2005-190417 A | 7/2005 |
| JP | 2005-191705 A | 7/2005 |
| JP | 2005-192124 A | 7/2005 |
| JP | 2005-204038 A | 7/2005 |
| JP | 2005-210223 A | 8/2005 |
| JP | 2005-210676 A | 8/2005 |
| JP | 2005-210680 A | 8/2005 |
| JP | 2005-217822 A | 8/2005 |
| JP | 2005-229474 A | 8/2005 |
| JP | 2005-236339 A | 9/2005 |
| JP | 2005-244778 A | 9/2005 |
| JP | 2005-252853 A | 9/2005 |
| JP | 2005-275870 A | 10/2005 |
| JP | 2005-284352 A | 10/2005 |
| JP | 2005-284455 A | 10/2005 |
| JP | 2005-293537 A | 10/2005 |
| JP | 2005-295135 A | 10/2005 |
| JP | 2005-311205 A | 11/2005 |
| JP | 2005-321305 A | 11/2005 |
| JP | 2005-322119 A | 11/2005 |
| JP | 2005-335755 A | 12/2005 |
| JP | 2005-340759 A | 12/2005 |
| JP | 2005-345802 A | 12/2005 |
| JP | 2005-346820 A | 12/2005 |
| JP | 2005-352858 A | 12/2005 |
| JP | 2006-013976 A | 1/2006 |
| JP | 2006-13976 A | 1/2006 |
| JP | 2006-025390 A | 1/2006 |
| JP | 2006-031766 A | 2/2006 |
| JP | 2006-033312 A | 2/2006 |
| JP | 2006-39902 A | 2/2006 |
| JP | 2006-039947 A | 2/2006 |
| JP | 2006-42059 A | 2/2006 |
| JP | 2006-42097 A | 2/2006 |
| JP | 2006-050200 A | 2/2006 |
| JP | 2006-053833 A | 2/2006 |
| JP | 2006-67479 A | 3/2006 |
| JP | 2006-72706 A | 3/2006 |

(56) References Cited

FOREIGN PATENT DOCUMENTS

| | | |
|---|---|---|
| JP | 2006-074348 A | 3/2006 |
| JP | 2006-80367 A | 3/2006 |
| JP | 2006-92630 A | 4/2006 |
| JP | 2006-102953 A | 4/2006 |
| JP | 2006-107296 A | 4/2006 |
| JP | 2006-513594 A | 4/2006 |
| JP | 2006-148462 A | 6/2006 |
| JP | 2006-148518 A | 6/2006 |
| JP | 2006-151402 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-238282 A | 9/2006 |
| JP | 2006-246372 A | 9/2006 |
| JP | 2006-270212 A | 10/2006 |
| JP | 2006-270681 A | 10/2006 |
| JP | 2006-270766 A | 10/2006 |
| JP | 2006-285911 A | 10/2006 |
| JP | 2006-287659 A | 10/2006 |
| JP | 2006-295879 A | 10/2006 |
| JP | 2003-309401 A | 11/2006 |
| JP | 2006-302219 A | 11/2006 |
| JP | 2006-311239 A | 11/2006 |
| JP | 2006-323481 A | 11/2006 |
| JP | 2006-339964 A | 12/2006 |
| JP | 2007-007888 A | 1/2007 |
| JP | 2007-13120 A | 1/2007 |
| JP | 2007-18067 A | 1/2007 |
| JP | 2007-019905 A | 1/2007 |
| JP | 2007-28002 A | 2/2007 |
| JP | 2007-040702 A | 2/2007 |
| JP | 2007-043535 A | 2/2007 |
| JP | 2007-048126 A | 2/2007 |
| JP | 2007-65822 A | 3/2007 |
| JP | 2007-79687 A | 3/2007 |
| JP | 2007-81712 A | 3/2007 |
| JP | 2007-096768 A | 4/2007 |
| JP | 2007-102348 A | 4/2007 |
| JP | 2007-116347 A | 5/2007 |
| JP | 2007-122542 A | 5/2007 |
| JP | 2007-150642 A | 6/2007 |
| JP | 2007-150868 A | 6/2007 |
| JP | 2007-159083 A | 6/2007 |
| JP | 2007-159129 A | 6/2007 |
| JP | 2007-166133 A | 6/2007 |
| JP | 3975918 B2 | 6/2007 |
| JP | 2007-172369 A | 7/2007 |
| JP | 2007-172527 A | 7/2007 |
| JP | 2007-524942 A | 8/2007 |
| JP | 2007-228254 A | 9/2007 |
| JP | 2007-228325 A | 9/2007 |
| JP | 2007-233597 A | 9/2007 |
| JP | 2007-241789 A | 9/2007 |
| JP | 2007-266999 A | 10/2007 |
| JP | 2007-272264 A | 10/2007 |
| JP | 2007-287128 A | 11/2007 |
| JP | 2007-295557 A | 11/2007 |
| JP | 2007-312350 A | 11/2007 |
| JP | 2007-324865 A | 12/2007 |
| JP | 2008-033716 A | 2/2008 |
| JP | 2008-042910 A | 2/2008 |
| JP | 2008-72243 A | 3/2008 |
| JP | 2008-083867 A | 4/2008 |
| JP | 2008-092131 A | 4/2008 |
| JP | 2008-097426 A | 4/2008 |
| JP | 2008-098993 A | 4/2008 |
| JP | 4069958 B2 | 4/2008 |
| JP | 2008-103691 A | 5/2008 |
| JP | 2008-107947 A | 5/2008 |
| JP | 2008-513888 A | 5/2008 |
| JP | 2008-148345 A | 6/2008 |
| JP | 2008-519347 A | 6/2008 |
| JP | 2008-160874 A | 7/2008 |
| JP | 2008-167190 A | 7/2008 |
| JP | 2008-197714 A | 8/2008 |
| JP | 2008-535372 A | 8/2008 |
| JP | 2008-207875 A | 9/2008 |
| JP | 2008-211572 A | 9/2008 |
| JP | 2008-217406 A | 9/2008 |
| JP | 2008-226099 A | 9/2008 |
| JP | 2008-288845 A | 11/2008 |
| JP | 2008-288915 A | 11/2008 |
| JP | 2009-017284 A | 1/2009 |
| JP | 2009-021970 A | 1/2009 |
| JP | 2009-25870 A | 2/2009 |
| JP | 2009-27291 A | 2/2009 |
| JP | 2009-044647 A | 2/2009 |
| JP | 2009-044715 A | 2/2009 |
| JP | 3148168 U | 2/2009 |
| JP | 2009-110144 A | 5/2009 |
| JP | 2009-153166 A | 7/2009 |
| JP | 2009-182630 A | 8/2009 |
| JP | 2009-213169 A | 9/2009 |
| JP | 2010-009196 A | 1/2010 |
| JP | 2010-050844 A | 3/2010 |
| JP | 2010-081571 | 4/2010 |
| JP | 4609604 B2 | 1/2011 |
| NL | 9100176 A | 3/1992 |
| NL | 9100347 A | 3/1992 |
| WO | 98/33142 A1 | 7/1998 |
| WO | 99/67754 A1 | 12/1999 |
| WO | 00/10122 A2 | 2/2000 |
| WO | 01/95242 A2 | 12/2001 |
| WO | 02/48980 A1 | 6/2002 |
| WO | 02/061675 A1 | 8/2002 |
| WO | 02/097723 A1 | 12/2002 |
| WO | 03/079305 A1 | 9/2003 |
| WO | 2004/036772 A2 | 4/2004 |
| WO | 2004/070879 A | 8/2004 |
| WO | 2004/072892 A2 | 8/2004 |
| WO | 2005/073937 A | 8/2005 |
| WO | 2005/091434 A1 | 9/2005 |
| WO | 2005/115849 A1 | 12/2005 |
| WO | 2006/045682 A | 5/2006 |
| WO | 20061048663 A1 | 5/2006 |
| WO | 2006/114821 A1 | 11/2006 |
| WO | 2007/083574 A1 | 7/2007 |
| WO | 2007/083575 A1 | 7/2007 |
| WO | 2007/086130 A1 | 8/2007 |
| WO | 2007/094494 A1 | 8/2007 |
| WO | 20071097385 A1 | 8/2007 |
| WO | 2007/102360 A1 | 9/2007 |
| WO | 20071105348 A1 | 9/2007 |
| WO | 2007/119310 A1 | 10/2007 |
| WO | 2007/125683 A1 | 11/2007 |
| WO | 2007/132094 A1 | 11/2007 |
| WO | 2007/138857 A1 | 12/2007 |
| WO | 2008/007606 A | 1/2008 |
| WO | 2008/081699 A1 | 7/2008 |
| WO | 2008/126458 A1 | 10/2008 |
| WO | 2008/140037 A1 | 11/2008 |
| WO | 2008/142957 A1 | 11/2008 |
| WO | 20081133018 A1 | 11/2008 |
| WO | 20081142957 A1 | 11/2008 |
| WO | 2009/008296 A1 | 1/2009 |
| WO | 2009/011144 A1 | 1/2009 |
| WO | 2009/011376 A1 | 1/2009 |
| WO | 2009/011400 A1 | 1/2009 |
| WO | 2009/011423 A1 | 1/2009 |
| WO | 2009/081719 A1 | 7/2009 |
| WO | 2009/110381 A1 | 9/2009 |
| WO | 2009/119548 A1 | 10/2009 |
| WO | 2009/128437 A1 | 10/2009 |
| WO | 2010/026939 A1 | 3/2010 |

OTHER PUBLICATIONS

Official communication issued in Japanese Application No. 2007-531525, mailed on Sep. 25, 2007.
Official communication issued in Japanese Application No. 2007-531524, mailed on Dec. 12, 2007.

(56) References Cited

OTHER PUBLICATIONS

Official communication issued in European Application No. 07706650.4, mailed on Nov. 24, 2008.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna", U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.

Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed on Mar. 25, 2008.
Osamura et al.: "Packaging Material With Electromagnetic Coupling Module,"; U.S. Appl. No. 12/536,669, filed Aug. 6, 2009.
Osamura et al.: "Packaging Material With Electromagnetic Coupling Module,"; U.S. Appl. No. 12/536,669; filed Aug. 6, 2009.
Dokai et al.: "Wireless IC Device and Component for Wireless IC Device,"; U.S. Appl. No. 12/543,553, filed Aug. 19, 2009.
Shioya et al.: "Wireless IC Device,"; U.S. Appl. No. 12/551,037, filed Aug. 31, 2009.
Ikemoto: "Wireless IC Device and Manufacturing Method Thereof,"; U.S. Appl. No. 12/579,672, filed Oct. 15, 2009.
Official communication issued in International Application No. PCT/JP2008/058614, mailed on Jun. 10, 2008.
Official Communication issued in International Patent Application No. PCT/JP2008/063025, mailed on Aug. 12, 2008.
Kato et al.: "Wireless IC Device,"; U.S. Appl. No. 12/603,608, filed Oct. 22, 2009.
Kato et al.: "Wireless IC Device,"; U.S. Appl. No. 12/688,072, filed Jan. 15, 2010.
Official Communication issued in International Patent Application No. PCT/JP2009/053693, mailed on Jun. 9, 2009.
Kato: "Composite Antenna,"; U.S. Appl. No. 12/845,846, filed Jul. 29, 2010.
Official Communication issued in International Patent Application No. PCT/JP2009/053690, mailed on Jun. 2, 2009.
Kato et al.: "Radio Frequency IC Device and Radio Communication System,"; U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device,"; U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device,"; U.S. Appl. No. 12/861,945, filed Aug. 24, 2010.
Kato: "Wireless IC Device and Electromagnetic Coupling Module,"; U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device"; U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.
Official Communication issued in International Patent Application No. PCT/JP2010/053496, mailed on Jun. 1, 2010.
Ikemoto: "Wireless IC Tag, Reader-Writer, and Information Processing System"; U.S. Appl. No. 13/329,354, filed Dec. 19, 2011.
Kato et al.: "Antenna and Antenna Module"; U.S. Appl. No. 13/334,462, filed Dec. 22, 2011.
Official Communication issued in International Patent Application No. PCT/JP2010/069418, mailed on Feb. 8, 2011.
Official Communication issued in International Patent Application No. PCT/JP2010/063082, mailed on Nov. 16, 2010.

(56) References Cited

OTHER PUBLICATIONS

Ikemoto: "Communication Terminal and Information Processing System"; U.S. Appl. No. 13/412,772, filed Mar. 6, 2012.
"Antenna Engineering Handbook", The Institute of Electronics and Communication Engineers, Mar. 5, 1999, pp. 20-21.
Official Communication issued in International Patent Application No. PCT/JP2010/066714, mailed on Dec. 14, 2010.
Nomura et al.: "Antenna and Wireless IC Device"; U.S. Appl. No. 13/419,454, filed Mar. 14, 2012.
Official Communication issued in International Patent Application No. PCT/JP2010/070607, mailed on Feb. 15, 2011.
Ito: "Wirelesss IC Device and Method of Detecting Environmental State Using the Device"; U.S. Appl. No. 13/421,889, filed Mar. 16, 2012.
Official Communication issued in International Patent Application No. PCT/JP2011/053654, mailed on Mar. 29, 2011.
Kato et al.: "Antenna Device and Mobile Communication Terminal"; U.S. Appl. No. 13/425,505, filed Mar. 21, 2012.
Official Communication issued in International Patent Application No. PCT/JP2010/069416, mailed on Feb. 8, 2011.
Kato et al.: "Wireless Communication Device and Metal Article"; U.S. Appl. No. 13/429,465, filed Mar. 26, 2012.
Official Communication issued in International Patent Application No. PCT/JP2011/055344, mailed on Jun. 14, 2011.
Kubo et al.: "Antenna and Mobile Terminal"; U.S. Appl. No. 13/452,972, filed Apr. 23, 2012.
Ikemoto: "RFID System"; U.S. Appl. No. 13/457,525, filed Apr. 27, 2012.
Ikemoto et al.: "Wireless IC Device and Electronic Apparatus"; U.S. Appl. No. 13/468,058, filed May 10, 2012.
Official Communication issued in International Patent Application No. PCT/JP2010/066291, mailed on Dec. 28, 2010.
Ikemoto: "Communication Terminal and Information Processing System"; U.S. Appl. No. 13/432,002, filed Mar. 28, 2012.
Official Communication issued in International Patent Application No. PCT/JP2010/070767, mailed on Feb. 22, 2011.
Ieki et al: "Transceiver and Radio Frequency Identification Tag Reader"; U.S. Appl. No. 13/437,978, filed Apr. 3, 2012.
Official Communication issued in International Patent Application No. PCT/JP2011/065431, mailed on Oct. 18, 2011.
Kato et al.: "Wireless IC Device"; U.S. Appl. No. 13/470,486, filed May 14, 2012.
Kato: "Wireless IC Device"; U.S. Appl. No. 12/789,610, filed May 28, 2010.
Kato: "Antenna and RFID Device"; U.S. Appl. No. 13/472,520, filed May 16, 2012.
Kato et al.: "Wireless IC Device and Component for Wireless IC Device"; U.S. Appl. No. 13/540,694, filed Jul. 3, 2012.
Dokai et al.: "Wireless IC Device and Component for Wireless IC Device"; U.S. Appl. No. 13/567,108, filed Aug. 6, 2012.
Dokai et al.: "Wireless IC Device and Component for Wireless IC Device"; U.S. Appl. No. 13/567,109, filed Aug. 6, 2012.
Official Communication issued in International Patent Application No. PCT/JP2011/052596, mailed on May 17, 2011.
Kato et al.: "Wireless IC Device"; U.S. Appl. No. 13/585,866, filed Aug. 15, 2012.
Murayama et al.: "Wireless Communication Module and Wireless Communication Device"; U.S. Appl. No. 13/598,872, filed Aug. 30, 2012.
Official Communication issued in International Patent Application No. PCT/JP2009/066336, mailed on Dec. 22, 2009.
Official Communication issued in corresponding Japanese Patent Application No. 2010-509439, mailed on Jul. 6, 2010.
Official Communication issued in corresponding Japanese Patent Application No. 2011-032311, mailed on Mar. 29, 2011.
Official Communication issued in corresponding Japanese Patent Application No. 2009-525327, drafted on Sep. 22, 2010.
Official Communication issued in corresponding Japanese Patent Application No. 2011-032311, mailed on Aug. 2, 2011.
Official Communication issued in corresponding Japanese Patent Application No. 2011-032312, mailed on Aug. 2, 2011.
Official Communication issued in corresponding Japanese Patent Application No. 2011-032311, mailed on Aug. 23, 2011.
Kato et al.: "Wireless IC Device Component and Wireless IC Device"; U.S. Appl. No. 13/241,823, filed Sep. 23, 2011.
Kato et al.: "Antenna Device and Method of Setting Resonant Frequency of Antenna Device"; U.S. Appl. No. 13/272,365, filed Oct. 13, 2011.
Official Communication issued in International Patent Application No. PCT/JP2010/056812, mailed on Jul. 13, 2010.
Dokai et al.: "Optical Disc"; U.S. Appl. No. 13/295,153, filed Nov. 14, 2011.
Official Communication issued in International Patent Application No. PCT/JP2010/057668, mailed on Aug. 17, 2010.
Osamura et al.: "Radio Frequency IC Device and Method of Manufacturing the Same"; U.S. Appl. No. 13/308,575, filed Dec. 1, 2011.
Official Communication issued in International Patent Application No. PCT/JP2010/069417, mailed on Dec. 7, 2010.
Kato: "Wireless IC Device and Coupling Method for Power Feeding Circuit and Radiation Plate"; U.S. Appl. No. 13/325,273, filed Dec. 14, 2011.
Official Communication issued in International Patent Application No. PCT/JP2009/069486, mailed on Mar. 2, 2010.
Kato: "Radio IC Device"; U.S. Appl. No. 13/080,775, filed Apr. 6, 2011.
Kato et al.: "Antenna and Wireless IC Device"; U.S. Appl. No. 13/083,626, filed Apr. 11, 2011.
Official Communication issued in International Patent Application No. PCT/JP2009/070617, mailed on Mar. 16, 2010.
Nagai, "Mounting Technique of RFID by Roll-To-Roll Process", Material Stage, Technical Information Institute Co., LTD vol. 7, No. 9, 2007, pp. 4-12.
Dokai et al.: "Wireless IC Device"; U.S. Appl. No. 13/088,480, filed Apr. 18, 2011.
Kato et al.: "High-Frequency Device and Wireless IC Device"; U.S. Appl. No. 13/094,928, filed Apr. 27, 2011.
Dokai et al.: "Wireless IC Device"; U.S. Appl. No. 13/099,392, filed on May 3, 2011.
Kato et al.: "Radio Frequency IC Device"; U.S. Appl. No. 13/163,803, filed Jun. 20, 2011.
Official Communication issued in International Patent Application No. PCT/JP2010/050170, mailed on Apr. 13, 2010.
Official Communication issued in International Patent Application No. PCT/JP2010/051205, mailed on May 11, 2010.
Kato: "Wireless IC Device, Wireless IC Module and Method of Manufacturing Wireless IC Module"; U.S. Appl. No. 13/169,067, filed Jun. 27, 2011.
Kato et al.: "Antenna and Wireless IC Device"; U.S. Appl. No. 13/190,670, filed Jul. 26, 2011.
Shiroki et al.: "RFIC Chip Mounting Structure"; U.S. Appl. No. 13/223,429, filed Sep. 1, 2011.
Official Communication issued in International Patent Application No. PCT/JP2010/056559, mailed on Jul. 27, 2010.
Taniguchi et al.: "Antenna Device and Radio Frequency IC Device"; U.S. Appl. No. 13/232,102, filed Sep. 14, 2011.
Official communication issued in counterpart International Application No. PCT/JP2008/071502, mailed Feb. 24, 2009.
Kato et al.: "Wireless IC Device and Manufacturing Method Thereof," U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device,"; U.S. Appl. No. 12/469,896, filed May 21, 2009.
Ikemoto et al.: "Wireless IC Device,"; U.S. Appl. No. 12/496,709, filed Jul. 2, 2009.
Official communication issued in counterpart International Application No. PCT/JP2008/062947, mailed Aug. 19, 2008.
Official communication issued in counterpart International Application No. PCT/JP2008/055567, mailed May 20, 2008.

(56) References Cited

OTHER PUBLICATIONS

Ikemoto et al.: "Wireless IC Device and Electronic Apparatus,"; U.S. Appl. No. 12/503,188, filed Jul. 15, 2009.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device,"; U.S. Appl. No. 12/510,338, filed Jul. 28, 2009.
Kato et al.: "Wireless IC Device,"; U.S. Appl. No. 12/510,340, filed Jul. 28, 2009.
Kato: "Wireless IC Device,"; U.S. Appl. No. 12/510,344, filed Jul. 28, 2009.
Kato et al.: "Wireless IC Device,"; U.S. Appl. No. 12/510,347, filed Jul. 28, 2009.
Official Communication issued in International Patent Application No. PCT/JP2009/056934, mailed on Jun. 30, 2009.
Kato et al.: "Wireless IC Device"; U.S. Appl. No. 12/903,242, filed Oct. 13, 2010.
Kato et al.: "Wireless IC Device"; U.S. Appl. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.
Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099, filed Nov. 11, 2010.
Kato et al.: Wireless IC Device and Manufacturing Method Thereof; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.
Ikemoto et al.:"Radio IC Device"; U.S. Appl. No. 12/981,582, filed Dec. 30, 2010.
Official Communication issued in International Patent Application No. PCT/JP2009/062801, mailed on Oct. 27, 2009.
Ikemoto et al.: "Wireless IC Device and Electronic Apparatus"; U.S. Appl. No. 13/022,695, filed Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.
Official Communication issued in corresponding Japanese Patent Application No. 2012-503049, mailed on Jun. 25, 2013.

\* cited by examiner

RADIO COMMUNICATION DEVICE AND RADIO COMMUNICATION TERMINAL

BACKGROUND OF THE INVENTION

1. Field of the Invention

The present invention relates to radio communication devices and radio communication terminals, and, more particularly, to a radio communication device and a radio communication terminal preferably for use in an RFID (Radio Frequency Identification) system, for example.

2. Description of the Related Art

In recent years, RFID systems have been used as information management systems for products in which transmission of predetermined information is performed in a non-contact manner between a reader/writer for generating an induction field and an RFID tag (hereinafter also referred to as a radio communication device) attached to a product. The RFID tag includes a radio frequency IC for storing predetermined information and processing a predetermined radio signal and an antenna for transmitting/receiving a high-frequency signal.

International Publication No. WO2007/083574 discloses a radio frequency IC device used in an RFID system. This radio frequency IC device includes a feeding circuit board on which a radio frequency IC chip is mounted. The feeding circuit board is coupled to a radiation plate (antenna pattern) primarily via a magnetic field. In the radio frequency IC device, the frequency of a transmission/receiving signal is determined by a feeding circuit included in the feeding circuit board. Accordingly, an operating frequency does not depend on the size of the antenna pattern and a material used for a device supporting member, and provides a stable frequency characteristic.

International Publication No. WO2007/083574 further discloses an example of a radio frequency IC device in which a feeding circuit board on which a radio frequency IC chip is mounted is disposed on the surface of a resin film on which an antenna pattern is provided. In this device, the antenna pattern includes a loop pattern, and the feeding circuit board is disposed at the center of the loop pattern. The antenna pattern and an inductor pattern in the feeding circuit board are magnetically coupled to each other. When a metal body is disposed in or close to a region in which the magnetic field is provided, the metal body interferes with the formation of the magnetic field. As a result, a communication range may be reduced or communication may be significantly deteriorated. When the position of the feeding circuit board deviates from the center of the loop pattern, a frequency characteristic may be changed.

SUMMARY OF THE INVENTION

To overcome the problems described above, preferred embodiments of the present invention provide a radio communication device and a radio communication terminal which are capable of achieving coupling between a loop electrode in a feeding circuit board and an antenna pattern and efficient signal transmission.

A radio communication device according to a first preferred embodiment of the present invention preferably includes a radio frequency IC configured to process a radio signal, a feeding circuit board that is coupled to the radio frequency IC and includes a loop electrode including a coil pattern having a predetermined winding width, and an antenna pattern that is magnetically coupled to the loop electrode. The feeding circuit board is arranged so that, in plan view as seen from a coil axis direction, a first region of the loop electrode in which the coil pattern extends in a first direction overlaps the antenna pattern and a second region of the loop electrode in which the coil pattern extends in a second direction opposite to the first direction does not overlap the antenna pattern. The first direction and a line length direction of the antenna pattern are preferably the same or substantially the same.

A radio communication terminal according to a second preferred embodiment of the present invention includes the radio communication device.

In the radio communication device, the first region of the loop electrode in which the coil pattern extends in the first direction overlaps the antenna pattern. Accordingly, even when another metal body is disposed close to the radio communication device, the magnetic field coupling between the loop electrode and the antenna pattern is maintained at a position in which the loop electrode and the antenna pattern overlap, and no problems occur. Furthermore, since the first direction and the line length direction of the antenna pattern are the same or are substantially the same, efficient signal transmission is achieved.

According to various preferred embodiments of the present invention, it is possible to achieve coupling between a loop electrode in a feeding circuit board and an antenna pattern and efficient signal transmission.

The above and other elements, features, steps, characteristics, and advantages of the present invention will become more apparent from the following detailed description of the preferred embodiments with reference to the attached drawings.

DETAILED DESCRIPTION OF THE PREFERRED EMBODIMENTS

Figure 1A:
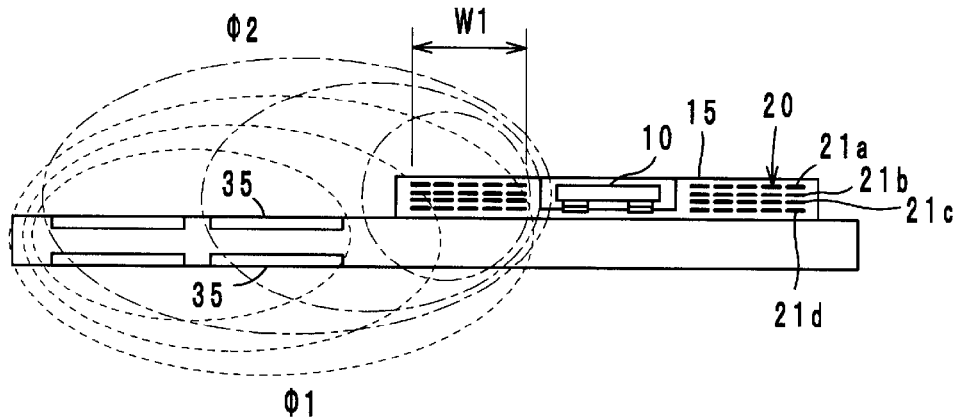
FIG. 1A is a diagram of a comparative example of the present invention.

A radio communication device and a radio communication terminal according to preferred embodiments of the present invention will be described below with reference to the accompanying drawings. In the drawings, the same reference numeral is used to represent the same component or the same element so as to avoid repeated explanation.

A general description of the principle of coupling between a loop electrode and an antenna pattern in a radio communication device according to various preferred embodiments of the present invention will be described.

FIG. 1A illustrates a comparative example of a coupling state. A radio communication device includes a radio frequency IC chip 10 configured to process a radio signal, a feeding circuit board 15, and an antenna pattern 35. The feeding circuit board 15 includes a loop electrode 20 that is coupled to the radio frequency IC chip 10 and includes coil patterns 21a to 21d having a predetermined winding width W1. The antenna pattern 35 is coupled to the loop electrode 20 by magnetic field coupling (in various preferred embodiments of the present invention, magnetic field coupling includes electromagnetic field coupling). The shapes of the loop electrode 20 and the antenna pattern 35 will be described in detail below with respect to a first preferred embodiment of the present invention.

In FIG. 1A, the loop electrode 20 does not overlap the antenna pattern 35 in plan view. Accordingly, a magnetic field φ1 is generated by the antenna pattern 35 as indicated by dotted lines, a magnetic field φ2 is generated by the loop electrode 20 as indicated by alternate long and short dashed lines, and the antenna pattern 35 and the loop electrode 20 are magnetically coupled to each other. However, when a metal body is disposed in close proximity to the antenna pattern 35, a point at which the disturbance of a magnetic field occurs and communication cannot be performed, that is, a null point, may be generated. In this case, a communication range is reduced or communication is deteriorated.

Figure 1B:
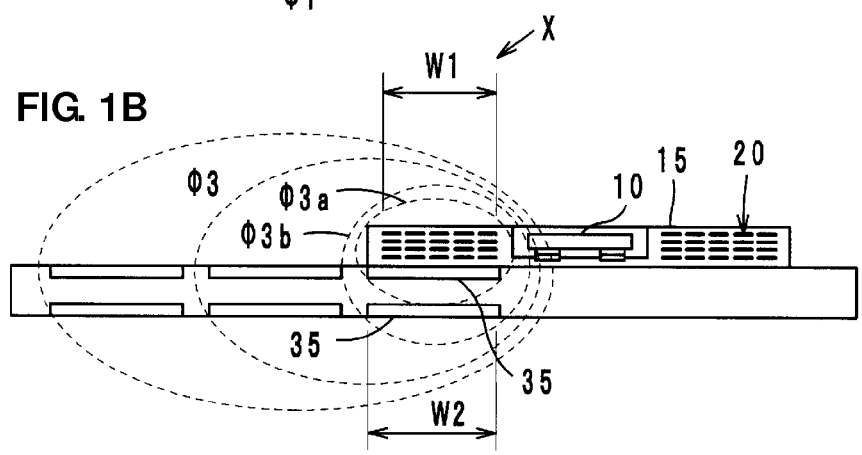
FIG. 1B is a diagram of a first arrangement example according to a preferred embodiment of the present invention.

In the case of a first arrangement example in a radio communication device according to a preferred embodiment of the present invention, as illustrated in FIG. 1B, in plan view of the feeding circuit board 15 from the axial direction of the loop electrode 20, a width W1 of a first region X of the coil patterns 21a to 21d in a first direction represented by an arrow x (see FIG. 5) preferably completely overlaps a width W2 of the antenna pattern 35. In this case, the loop electrode 20 and the antenna pattern 35 are coupled via a magnetic field φ3 represented by dotted lines. Even when a metal body is disposed in close proximity to the antenna pattern 35, at least the magnetic fields 43a and 43b are not disturbed. Accordingly, the coupling between the loop electrode 20 and the antenna pattern 35 is effectively maintained. Since the first direction and the line length direction of the antenna pattern 35 are preferably the same or substantially the same, efficient signal transmission is achieved.

Figure 1C:
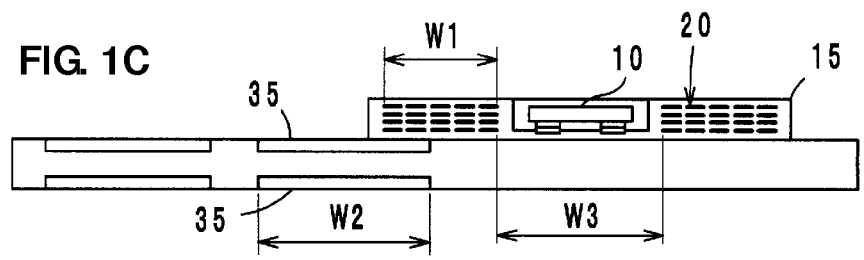
FIG. 1C is a diagram of a second arrangement example according to a preferred embodiment of the present invention.

In the case of a second arrangement example according to a preferred embodiment of the present invention, as illustrated in FIG. 1C, approximately half of the width W1 of the first region X of the loop electrode 20 preferably overlaps the width W2 of the antenna pattern 35. In this case, an effect similar to that obtained in the case of the first arrangement example is obtained.

Furthermore, in the case of the second arrangement example, in plan view of the feeding circuit board 15 from the coil axis direction of the loop electrode 20 (the coil patterns 21a to 21d), the openings (opening width W3) of the coil patterns 21a to 21d preferably do not overlap the antenna pattern 35. Accordingly, magnetic fluxes generated at the coil patterns 21a to 21d are not significantly interrupted by the antenna pattern 35. As a result, problems changing inductance values of the coil patterns 21a to 21d or a reduced degree of coupling that produces an energy loss and reduces a communication range are overcome.

Figure 1D:
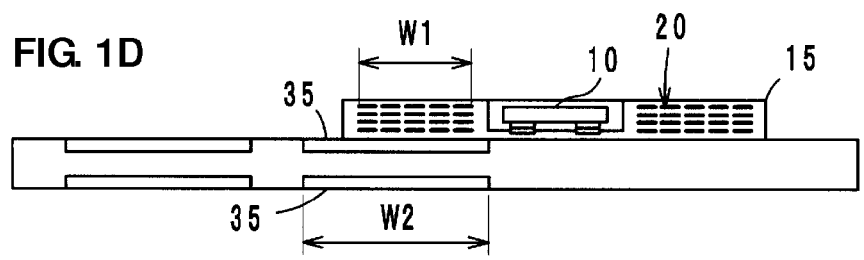
FIG. 1D is a diagram of a third arrangement example according to a preferred embodiment of the present invention.

In the case of a third arrangement example according to a preferred embodiment of the present invention, as illustrated in FIG. 1D, the width W2 of the antenna pattern 35 is preferably greater than the width W1 of the first region X of the loop electrode 20 and the first region X completely fits within the width W2 of the antenna pattern 35. In this case, an effect similar to that obtained in the case of the first arrangement example is obtained. By making the width W2 of the antenna pattern 35 greater than the width of the first region X, it is possible to completely fit the first region X within the width W2 of the antenna pattern 35 even when misalignment of the feeding circuit board 15 occurs. That is, it is necessary to fit a loop line including at least one turn (preferably a plurality of turns) in the loop electrode 20 within the width W2 of a line in the antenna pattern 35. The highest degree of coupling between the antenna pattern 35 and the loop electrode 20 is obtained by completely fitting the width W1 of the loop electrode 20 including a plurality of turns within the width W2 of the line in the antenna pattern 35 in plan view.

It is preferable that the width W1 of the first region X does not straddle each turn of the antenna pattern 35. When the first region X straddles two turns in the antenna pattern 35, a point at which currents flow in opposite directions and cancel each other is generated at the coil patterns 21a to 21d. This leads to a reduction in the coupling degree and a reduction in a communication range. By preventing the first region X from straddling each turn of the antenna pattern 35, such a problem is overcome.

First Preferred Embodiment

Figure 2A:
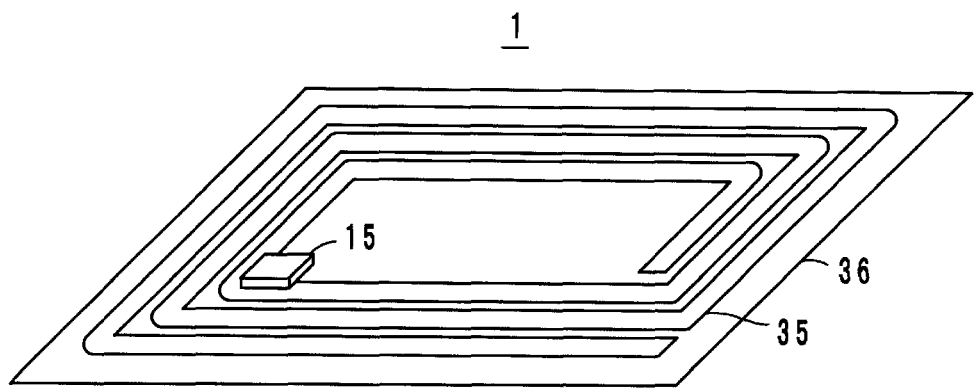
FIG. 2A is a perspective view of a radio communication device according to a first preferred embodiment of the present invention.
Figure 2B:
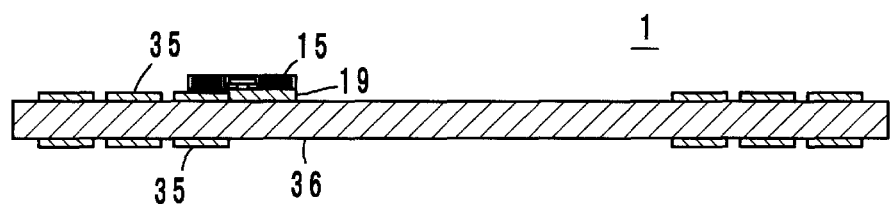
FIG. 2B is a cross-sectional view of the radio communication device.
Figure 2C:
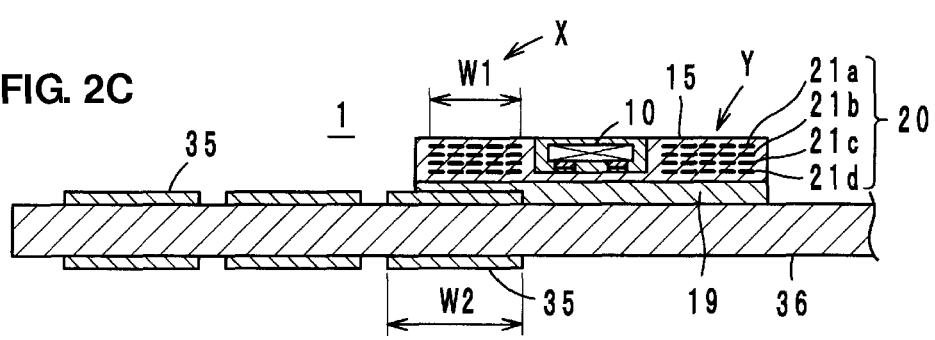
FIG. 2C is an enlarged cross-sectional view of a main portion of the radio communication device.

As illustrated in FIGS. 2A-2C, a radio communication device 1 according to the first preferred embodiment of the present invention is preferably used in a 13.56 MHz band, and preferably includes the radio frequency IC chip 10 configured to process a radio signal, the feeding circuit board 15, and the antenna pattern 35. The feeding circuit board 15 includes the loop electrode 20 that is electrically connected to the radio frequency IC chip 10 and includes the coil patterns 21a to 21d having the predetermined winding width W1 (see FIG. 5). The antenna pattern 35 is magnetically coupled to the loop electrode 20. The radio frequency IC chip 10 includes a clock circuit, a logic circuit, and a memory circuit, and stores necessary information. An input terminal electrode and an output terminal electrode which are provided on the lower surface of the radio frequency IC chip 10 are electrically connected to both ends of the loop electrode 20.

Figure 3A:
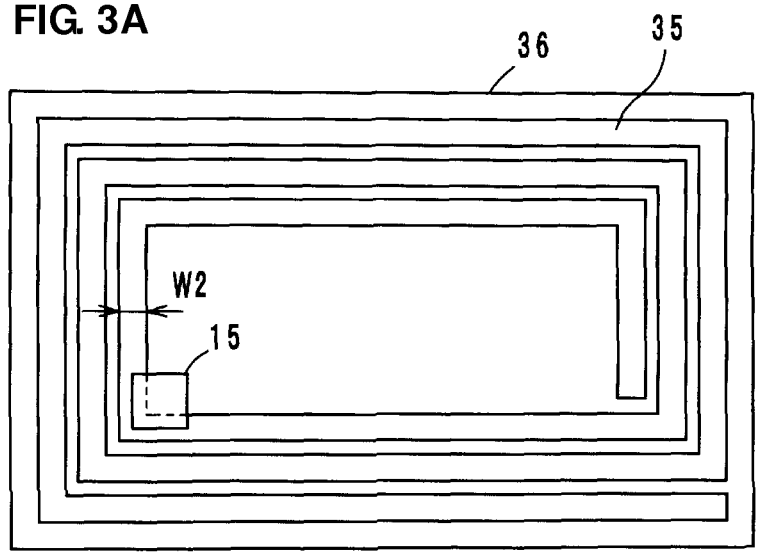
FIG. 3A is a diagram illustrating an antenna pattern according to the first preferred embodiment of the present invention on an upper surface.
Figure 3B:
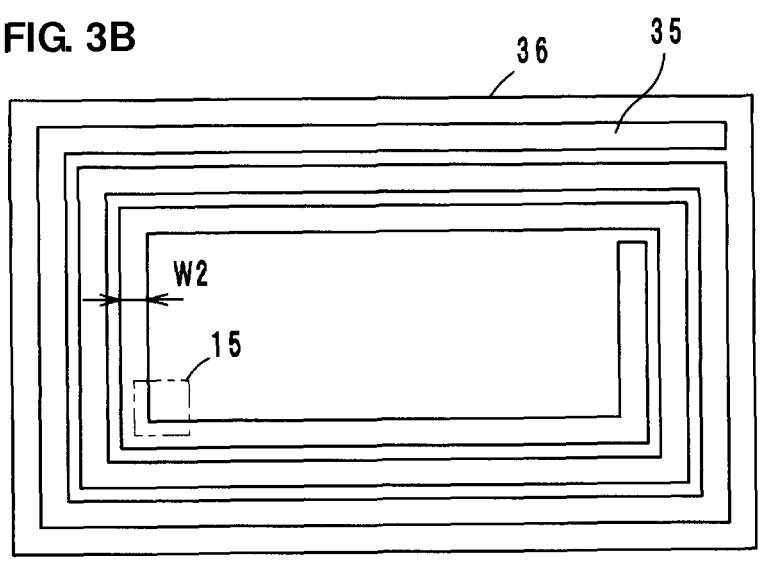
FIG. 3B is a diagram illustrating an antenna pattern according to the first preferred embodiment of the present invention on a lower surface.

The antenna pattern 35 preferably includes three winding turns, for example, and has a coil shape provided on the upper surface and the lower surface of a flexible base substrate 36 preferably made of, for example, PET, and both ends of the antenna pattern 35 are open ends. FIG. 3A illustrates the antenna pattern 35 on the upper surface, and FIG. 3B illustrates the antenna pattern 35 on the lower surface which is viewed in a perspective manner from the surface. The antenna patterns 35 provided on the upper surface and on the lower surface preferably have the same or substantially the same line width W2, overlap in plan view, and are capacitively coupled via the base substrate 36. In the antenna patterns 35, currents flow in the same direction. The antenna pattern 35 may preferably be made of a metal material primarily composed of Ag or Cu, for example, and may preferably be obtained by patterning a metal film with a photolithography method or an etching method, for example. Alternatively, the antenna pattern 35 may be obtained by screen printing a conductive paste.

Figure 4:
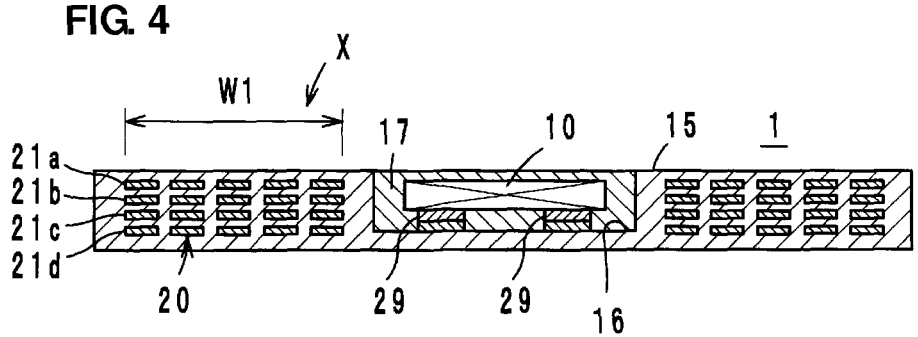
FIG. 4 is a cross-sectional view of a feeding circuit board according to the first preferred embodiment of the present invention.
Figure 5:
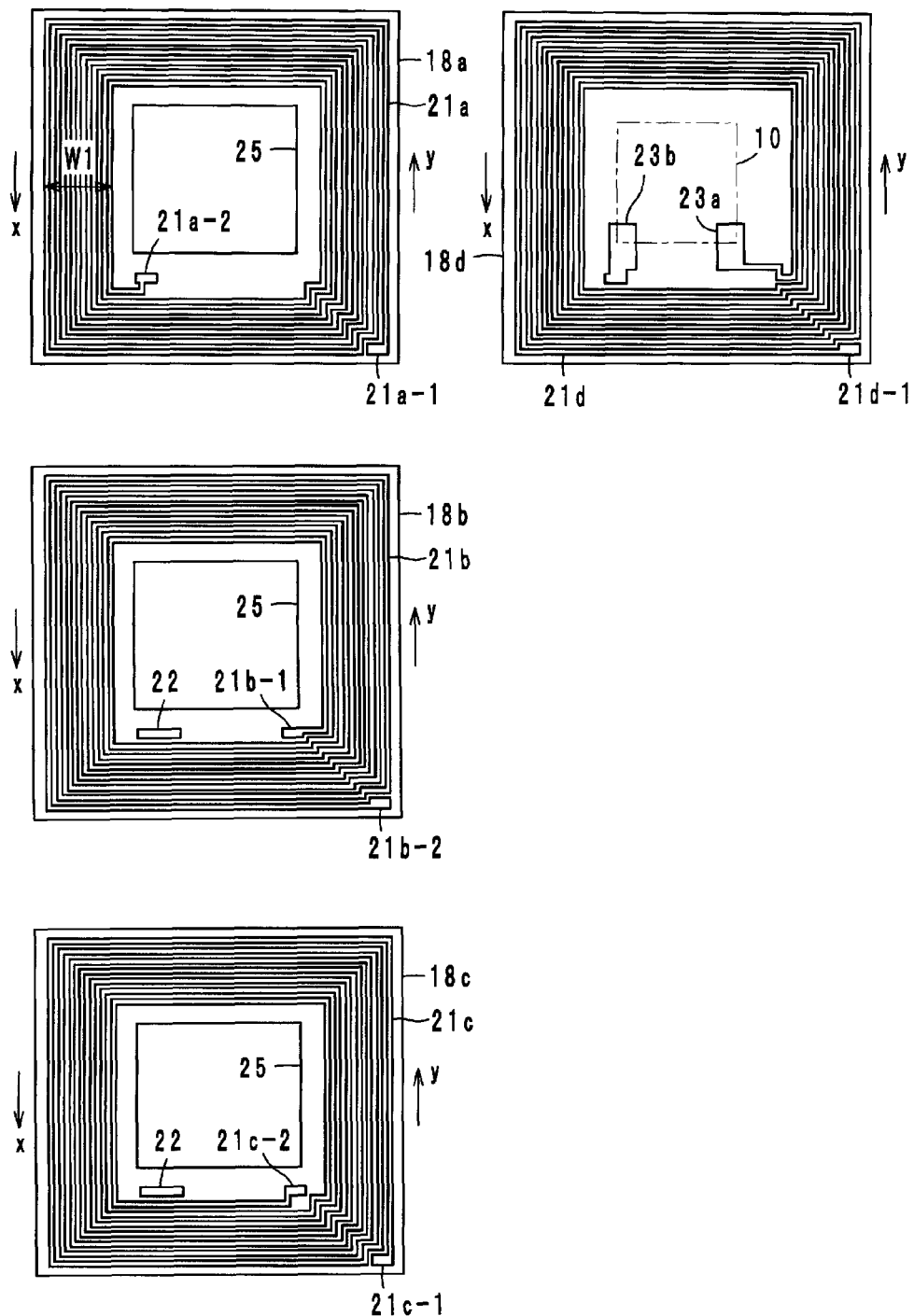
FIG. 5 is a plan view illustrating the layered structure of the feeding circuit board according to the first preferred embodiment of the present invention.

The feeding circuit board 15 is preferably a multilayer substrate, and includes a cavity 16 at a central portion as illustrated in FIG. 4. The cavity 16 accommodates the radio frequency IC chip 10 and is filled with a sealant 17. The feeding circuit board 15 includes the loop electrode 20 obtained by laminating the coil patterns 21a to 21d in multiple layers. More specifically, as illustrated in FIG. 5, preferably a plurality of base substrate layers 18a to 18d are laminated, press-bonded, and fired as appropriate. The base substrate layers 18a to 18d may preferably be made of an insulator (dielectric or magnetic substance), a thermoplastic resin such as liquid crystal polymer, or a thermosetting resin, such as epoxy polymer, for example.

In the uppermost base substrate layer 18a, an opening 25 is provided at the center or the approximate center and the coil pattern 21a including pads 21a-1 and 21a-2 at both ends thereof are provided. In the second base substrate layer 18b, the opening 25 is provided at the center or the approximate center and the coil pattern 21b including pads 21b-1 and 21b-2 at both ends thereof and a pad 22 are provided. In the third base substrate layer 18c, the opening 25 is provided at the center or the approximate center and the coil pattern 21c including pads 21c-1 and 21c-2 at both ends thereof and the pad 22 are provided. In the lowermost base substrate layer 18d, the coil pattern 21d including a land 23a at one end thereof and a pad 21d-1 at the other end thereof and a land 23b are provided. These coil patterns, pads, and lands may preferably be made of a metal material primarily composed of Ag or Cu, for example, and may preferably be obtained by patterning a metal film with a photolithography method or an etching method, for example. Alternatively, they may be obtained by screen printing a conductive paste.

By laminating the base substrate layers 18a to 18d, the pad 21d-1 of the coil pattern 21d in the lowermost layer is connected to the pad 21c-1 of the coil pattern 21c in the third layer via an interlayer conductor, and the pad 21c-2 at the other end of the coil pattern 21c is connected to the pad 21b-1 of the coil pattern 21b in the second layer via an interlayer conductor. The pad 21b-2 at the other end of the coil pattern 21b is connected to the pad 21a-1 of the coil pattern 21a in the uppermost layer via an interlayer conductor. The pad 21a-2 at the other end of the coil pattern 21a in the uppermost layer is connected to the land 23b in the undermost layer via an interlayer conductor and the pad 22.

The opening 25 defines the cavity 16. The input terminal electrode and the output terminal electrode of the radio frequency IC chip 10 disposed in the cavity 16 are connected to the land 23b and the land 23a, respectively, via solder bumps 29 (see FIG. 4).

When the coil patterns 21a to 21d are wound as described above, the loop electrode 20 that is preferably rectangular in plan view is provided. The predetermined winding width W1 of the coil patterns 21a to 21d is a distance between an inner pattern and an outer pattern. When a current is supplied from the land 23a, the current flows through the coil patterns 21a to 21d in two directions, a first direction represented by an arrow x and a second direction that is opposite to the first direction and is represented by an arrow y. That is, the coil patterns 21a to 21d are wound so that the directions of currents flowing through portions of the coil patterns 21a to 21d which are adjacent to one another in the lamination direction are the same. In FIG. 5, a region extending in the first direction x and a region extending in the second direction y in plan view from the coil axis direction are referred to as the first region X and a second region Y, respectively.

Figure 6A:
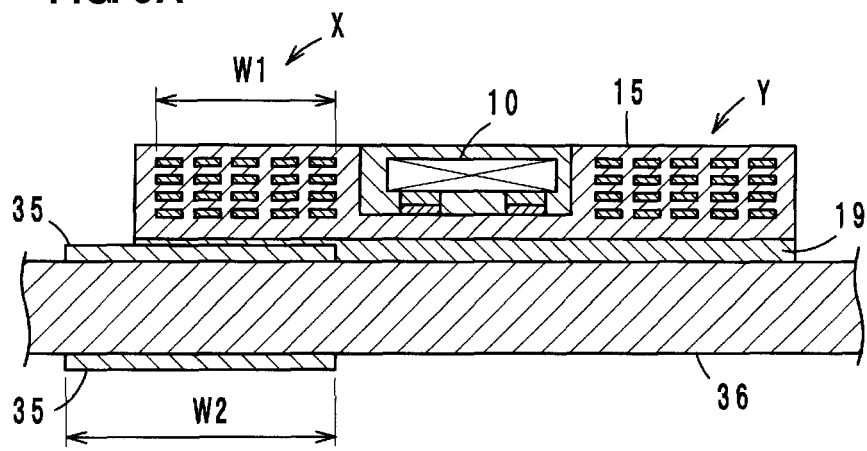
FIG. 6A is a cross-sectional view illustrating the positional relationship between an antenna pattern and a feeding circuit board according to the first preferred embodiment of the present invention.

In the first preferred embodiment, the feeding circuit board 15 is preferably arranged so that it faces the inner corner of the antenna pattern 35 on the surface (see FIG. 3A), and is attached to the antenna pattern 35 with an insulating adhesive 19 (see FIG. 6A). The vertical positional relationship between the antenna pattern 35 and the loop electrode 20 is preferably as illustrated in FIG. 6A. That is, the antenna pattern 35 and the loop electrode are arranged so that the first region X overlaps the antenna pattern 35 and the second region Y does not overlap the antenna pattern 35. The first direction x (the line length direction of the coil patterns 21a to 21d) and the line length direction of the antenna pattern 35 are preferably the same or substantially the same.

In the radio communication device 1 having the above-described configuration, the first region X of the loop electrode 20 is magnetically coupled to the antenna pattern 35. Accordingly, a high-frequency signal that has been emitted from a reader/writer in an RFID system and has been received by the antenna patterns 35 is supplied to the radio frequency IC chip 10 via the loop electrode 20, so that the radio frequency IC chip 10 operates. On the other hand, a response signal from the radio frequency IC chip 10 is transmitted to the antenna patterns 35 via the loop electrode 20 and is emitted to the reader/writer from the antenna pattern 35.

The loop electrode 20 defines a resonance circuit having a predetermined frequency with inductance components generated by the coil patterns 21a to 21d and capacitance components generated between lines, and also functions as an impedance matching circuit between the radio frequency IC chip 10 and the antenna pattern 35. The resonant frequency and impedance of the loop electrode 20 are adjusted by adjusting the electrical length and the pattern width of the loop electrode 20.

In the radio communication device 1, the first region X of the loop electrode 20 extending in the first direction x preferably overlaps the antenna pattern 35, so that the first region X is magnetically coupled to the antenna pattern 35. Accordingly, even when another metallic body is disposed close to the radio communication device, the magnetic field coupling between the loop electrode 20 and the antenna pattern 35 is maintained at a position at which the loop electrode 20 and the antenna pattern 35 overlap each other, and no problems occur. In particular, in this preferred embodiment, since the first region X of the loop electrode 20 overlaps the antenna pattern 35 throughout the width W1, variations in the value of a stray capacitance generated between the loop electrode 20 and the antenna pattern 35 do not significantly occur or occur at all. As a result, the change in a frequency characteristic is significantly reduced and prevented.

The first direction x (the line length direction of the coil patterns 21a to 21d) and the line length direction of the antenna patterns 35 are preferably the same or substantially the same. Accordingly, at the time of transmission of a high-frequency signal, a current that has flowed through the coil patterns 21a to 21d is guided in the line length direction of the antenna patterns 35 as an induced current and high-frequency power is efficiently transmitted. The line length directions of the coil patterns 21a to 21d and the antenna patterns 35 do not necessarily have to be the same in a magnetic field coupling portion, and may be substantially the same as long as the line length directions are not perpendicular or substantially perpendicular to each other.

Since the feeding circuit board 15 is arranged so that it faces the inner corner of the antenna pattern 35, a third region Z of the loop electrode 20 extending in a third direction (represented by an arrow z) perpendicular to the first direction also overlaps the antenna patterns 35 and the third direction z and the line length direction of the antenna pattern 35 are preferably the same or substantially the same. As a result, in both of the first region X and the third region Z, the loop electrode 20 and the antenna pattern 35 are magnetically coupled to each other and the degree of coupling therebetween is increased.

The feeding circuit board 15 provided with the radio frequency IC chip 10 thereon can perform short-range communication with a reader/writer without the antenna patterns 35. In this case, the loop electrode 20 functions as a radiation element.

In the first preferred embodiment, since the radio frequency IC chip 10 is disposed in the cavity 16 of the feeding circuit board 15, the profile of a radio communication module 5 is reduced. It is preferable that the depth of the cavity 16 be equal to or greater than half of the thickness of the feeding circuit board 15, for example. As a result, the inner circumference of the loop electrode 20 is mostly covered with the sealant 17 (the rigidity of a rigid region 15a is increased), a stress generated when a flexible region 15b is bent or deflected can be effectively prevented by the side surface of the cavity 16, and the stress is not significantly applied to the bottom surface of the cavity 16, that is, a point of coupling between the radio frequency IC chip 10 and the loop electrode 20.

In the first preferred embodiment, it is preferable that the sealant 17 include a magnetic filler such as ferrite powder, for example. As a result, it is possible to reduce radiation noise from the radio frequency IC chip 10 and increase the inductance values of the coil patterns 21a to 21d. From the viewpoint of increasing the inductance values, it is preferable that the cavity 16 is relatively deep as described previously.

Modifications of Feeding Circuit Board

Various manners of mounting the radio frequency IC chip 10 on the feeding circuit board 15 other than the manner illustrated in FIG. 4 in which the radio frequency IC chip 10 is disposed in the cavity 16 on the surface of the feeding circuit board 15 and the cavity 16 is sealed with the sealant 17 may be used. Various modifications of a feeding circuit board will be described.

Figure 7:
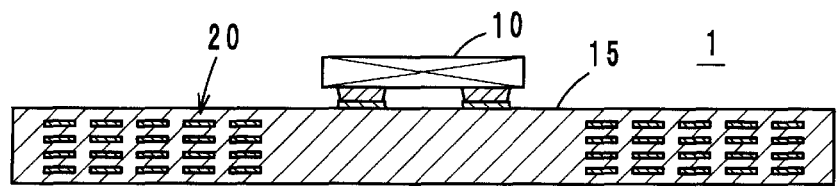
FIG. 7 is a cross-sectional view of a first modification of a feeding circuit board according to a preferred embodiment of the present invention.

In a first modification according to a preferred embodiment of the present invention illustrated in FIG. 7, the feeding circuit board 15 is planar and does not include a cavity. The radio frequency IC chip 10 is mounted on the flat surface of the feeding circuit board 15. The profile of the feeding circuit board 15 is increased by the thickness of the radio frequency IC chip 10. However, a step of forming a cavity in the feeding circuit board 15 is omitted. Furthermore, it is possible to increase the number of turns of the loop electrode 20 by providing a coil pattern in a region in which the formation of a cavity is omitted.

Figure 8:
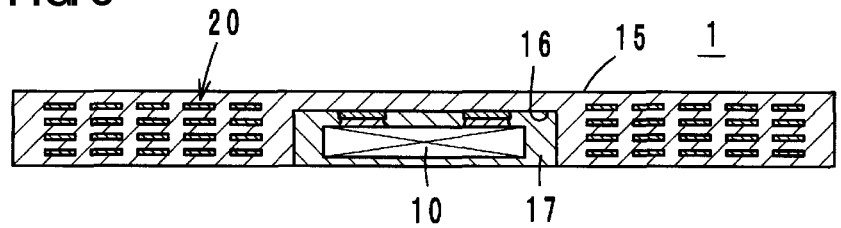
FIG. 8 is a cross-sectional view of a second modification of a feeding circuit board according to a preferred embodiment of the present invention.

In a second modification according to a preferred embodiment of the present invention illustrated in FIG. 8, the cavity 16 is provided on the lower surface of the feeding circuit board 15, the radio frequency IC chip 10 is disposed in the cavity 16, and the cavity 16 is sealed with the sealant 17. The sealing with the sealant 17 does not necessarily have to be performed. The reason for this is that the radio frequency IC chip 10 in the cavity 16 is protected by attaching the lower surface of the feeding circuit board 15 to a base film 36.

Figure 9:
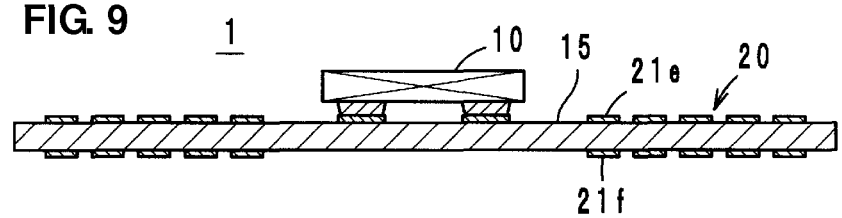
FIG. 9 is a cross-sectional view of a third modification of a feeding circuit board according to a preferred embodiment of the present invention.

In a third modification according to a preferred embodiment of the present invention illustrated in FIG. 9, coil patterns 21e and 21f defining the loop electrode 20 are disposed on the upper surface and the lower surface of the feeding circuit board 15, respectively, and the radio frequency IC chip 10 is mounted on the surface of the board 15. The feeding circuit board may preferably be a single-layered substrate, and a coil pattern may be provided on only the surface of the single-layered substrate.

Other Feeding Circuit Board Arrangements

Figure 6B:
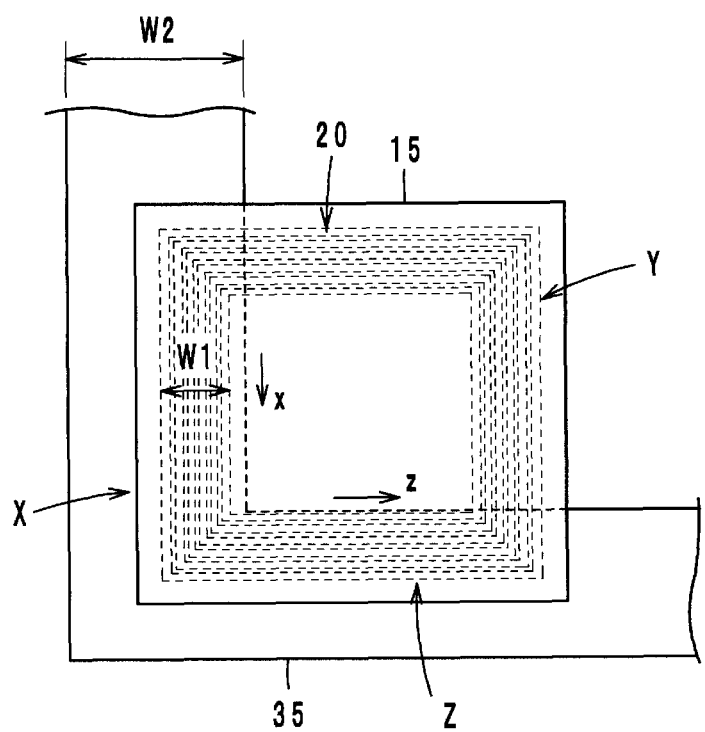
FIG. 6B is a plan view illustrating the positional relationship of a main portion of the first preferred embodiment of the present invention.
Figure 10:
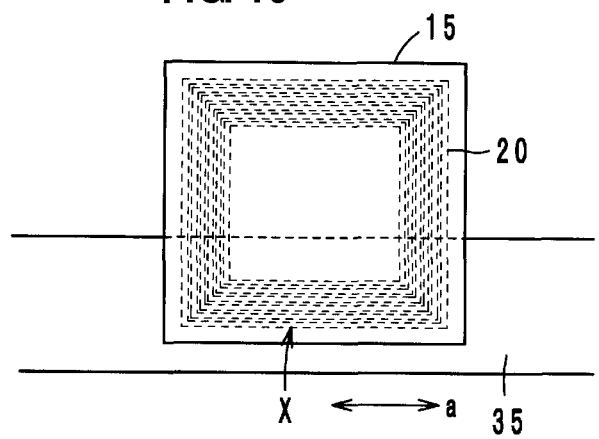
FIG. 10 is a plan view illustrating a first modification of the position of a feeding circuit board relative to an antenna pattern according to a preferred embodiment of the present invention.

Various manners in which the feeding circuit board 15 is arranged with respect to the antenna patterns 35 other than the manner illustrated in FIG. 6B in which the feeding circuit board 15 is mounted on the corner of the antenna pattern 35 may be used In a first modification according to a preferred embodiment of the present invention illustrated in FIG. 10, the first region X of the loop electrode 20 overlaps the straight portion of the antenna pattern 35. In this case, even when misalignment of the feeding circuit board 15 occurs in the line length direction (represented by an arrow a) of the antenna pattern 35, a frequency characteristic is not changed. The area of a portion of the loop electrode 20 (the coil patterns 21a to 21d) which is perpendicular or substantially perpendicular to the line length direction of the antenna pattern 35 and overlaps the antenna pattern 35 is preferably relatively small.

Figure 11:
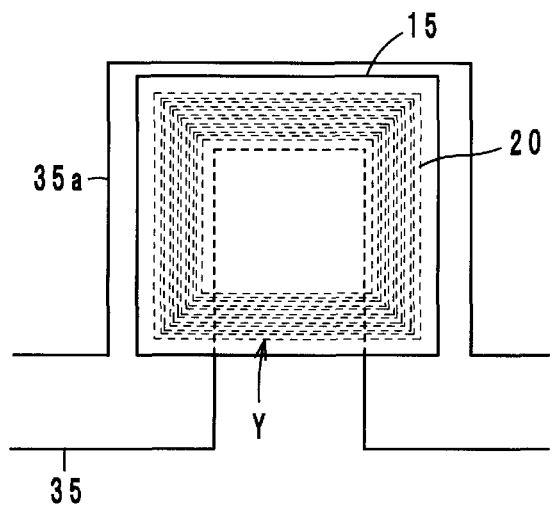
FIG. 11 is a plan view illustrating a second modification of the position of a feeding circuit board relative to an antenna pattern according to a preferred embodiment of the present invention.

In a second modification according to a preferred embodiment of the present invention illustrated in FIG. 11, a bending portion 35a is provided in the antenna pattern 35 and three sides of the loop electrode 20 (the coil patterns 21a to 21d) overlap the bending portion 35a. The second region Y does not overlap the antenna pattern 35. When a region in which the loop electrode 20 and the antenna pattern 35 overlap each other is increased, the degree of coupling therebetween is increased.

Figure 12:
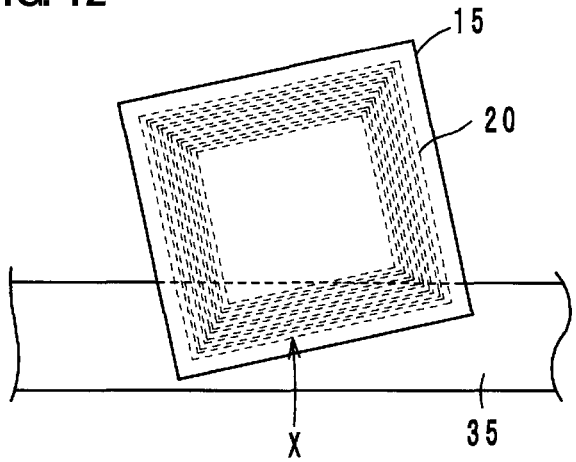
FIG. 12 is a plan view illustrating a third modification of the position of a feeding circuit board relative to an antenna pattern according to a preferred embodiment of the present invention.

In a third modification according to a preferred embodiment of the present invention illustrated in FIG. 12, the first region X of the loop electrode 20 is slightly inclined relative to the antenna pattern 35. That is, the loop electrode 20 (the coil patterns 21a to 21d) and the antenna pattern 35 are arranged so that the line length directions thereof are substantially the same in a magnetic coupling portion and an induced current flows from one of the loop pattern 20 and the antenna pattern 35 to the other one of the loop pattern 20 and the antenna pattern 35 in the line length direction.

Second Example of Feeding Circuit Board

Figure 13A:
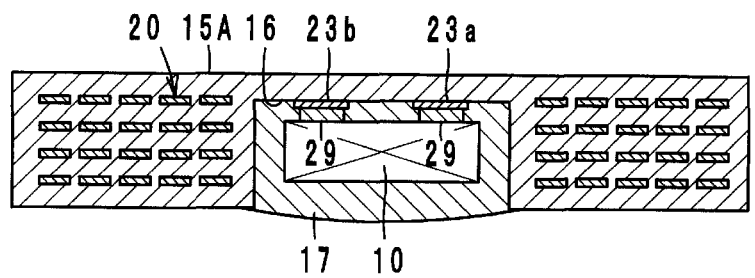
FIG. 13A is a cross-sectional view of a second example of a feeding circuit board according to a preferred embodiment of the present invention.
Figure 13B:
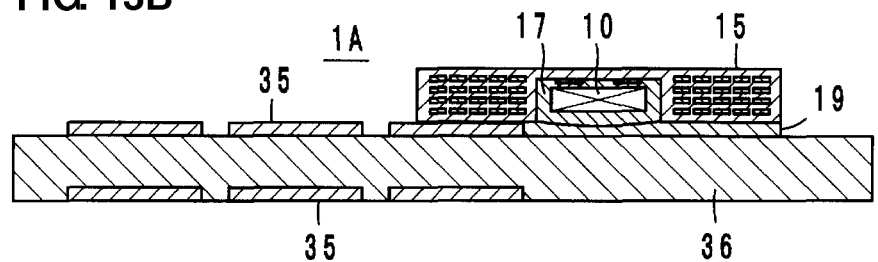
FIG. 13B is a cross-sectional view of a radio communication device including the feeding circuit board.

A second example of a feeding circuit board 15A according to a preferred embodiment of the present invention is obtained by providing the cavity 16 on the lower surface of the feeding circuit board 15, disposing the radio frequency IC chip 10 in the cavity 16, and filling the cavity 16 with the sealant 17 as illustrated in FIG. 13A. The feeding circuit board 15A is preferably the same or substantially the same as the feeding circuit board according to the first preferred embodiment except for the above-described configuration. As illustrated in FIG. 13B, the feeding circuit board 15A is attached to the base substrate 36 with the adhesive 19 in a state in which the opening of the cavity 16 faces the base substrate 36. As a result, a radio communication device 1A is provided.

The operational effects and advantages of the feeding circuit board 15A and the radio communication device 1A are substantially the same as that of the feeding circuit board and the radio communication device illustrated in FIGS. 3A and 3B. In particular, the radio frequency IC chip 10 is protected by the bottom surface (the upper surface in FIG. 13A) of the cavity 16. Since the smoothness of the bottom surface (the upper surface in FIG. 13A) of the feeding circuit board 15 is relatively high, a good suction performance is obtained when a mounter mounts the feeding circuit board 15A on the base substrate 36 by vacuum suction. Furthermore, as illustrated in FIG. 13A, since the sealant slightly protrudes from the cavity 16, a protruding portion provides an anchor effect when the feeding circuit board 15 is mounted on the base substrate 36 (i.e., is attached to the base substrate 36 with the adhesive 19) and the feeding circuit board 15 is securely and firmly coupled to the base substrate 36. Even when the sealant 17 has a concave shape, the anchor effect is still obtained.

Second Preferred Embodiment

Next, a radio communication device according to the second preferred embodiment of the present invention including the feeding circuit board 15 will be described.

Figure 14:
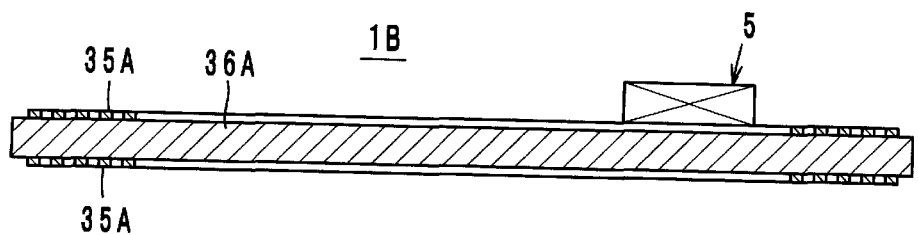
FIG. 14 is a cross-sectional view of a radio communication device according to a second preferred embodiment of the present invention.
Figure 15A:
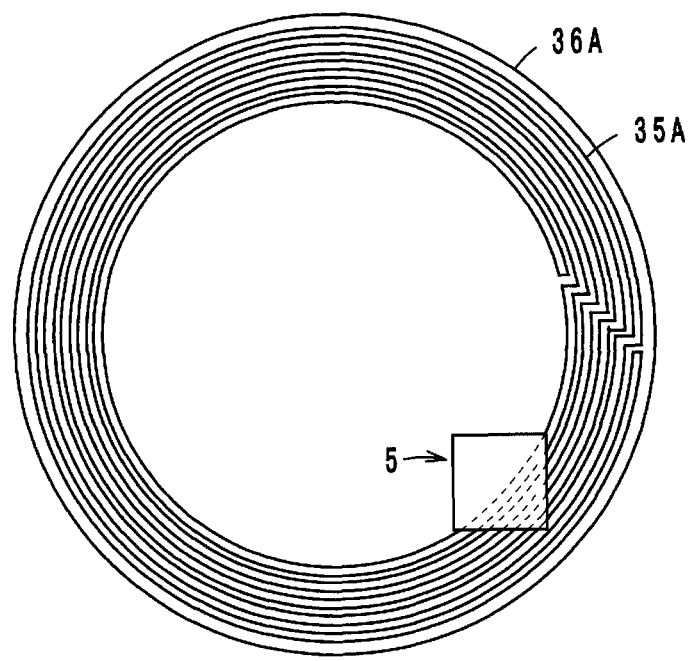
FIG. 15A is a diagram illustrating of an antenna pattern on an upper surface in the radio communication device illustrated in FIG. 14.
Figure 15B:
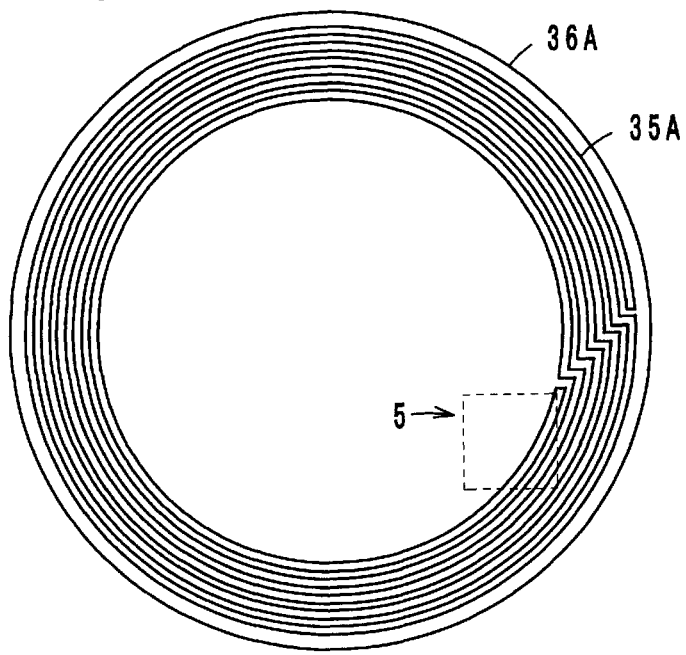
FIG. 15B is a diagram illustrating of an antenna pattern on a lower surface in the radio communication device illustrated in FIG. 14.
Figure 16:
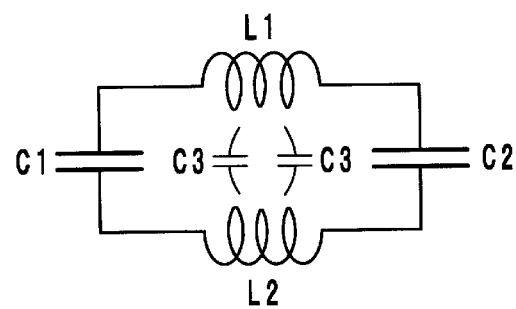
FIG. 16 is an equivalent circuit diagram of the second example of an antenna pattern according to a preferred embodiment of the present invention.

As illustrated in FIG. 14, a radio communication device 1B includes the feeding circuit board 15 mounted on a circular flexible base substrate 36A. On the upper and lower surfaces of the base substrate 36A, an antenna pattern 35A illustrated in FIGS. 15A and 15B is provided. FIG. 15B illustrates the antenna pattern 35A on the lower surface which is viewed in a perspective view from the upper surface. The antenna patterns 35A preferably include circular windings, overlap each other throughout their lengths in plan view, and are capacitively coupled to each other. The antenna patterns 35A define an equivalent circuit illustrated in FIG. 16 in which an inductor L1 defined by the antenna pattern 35A on the upper surface and an inductor L2 defined by the antenna pattern 35A on the lower surface are coupled via a capacitor C1 defined by the innermost patterns and a capacitor C2 defined by the outermost patterns, and a capacitor C3 is provided between the pattern on the surface and the pattern on the lower surface.

The effect of the antenna patterns 35A that are capacitively coupled to each other is similar to that of the antenna patterns 35 illustrated in FIGS. 3A and 3B, and currents flow through them in the same direction. The antenna patterns 35A and the coil electrode 20 in the feeding circuit board 15 that is disposed on the upper surface of the base substrate 36A and partially overlaps the antenna patterns 35A are magnetically coupled. Accordingly, an antenna in a reader/writer and the radio frequency IC chip 10 can communicate with each other via the antenna patterns 35A. The fundamental operational effects and advantages of the radio communication device 1B are the same or substantially the same as the above-described operational effects and advantages of the radio communication device 1.

In the radio communication device 1B, the ends of the antenna pattern 35A on the upper surface of the base substrate 36A may preferably be individually DC-connected to the ends of the antenna pattern 35A on the lower surface of the base substrate 36A by crimping, for example. Alternatively, ends of the antenna patterns 35A may be similarly DC-connected to each other. That is, the antenna patterns 35A on the upper surface and the lower surface are coupled to each other so that the directions of currents flowing therethrough are the same.

Third Example of Antenna Pattern

Figure 17:
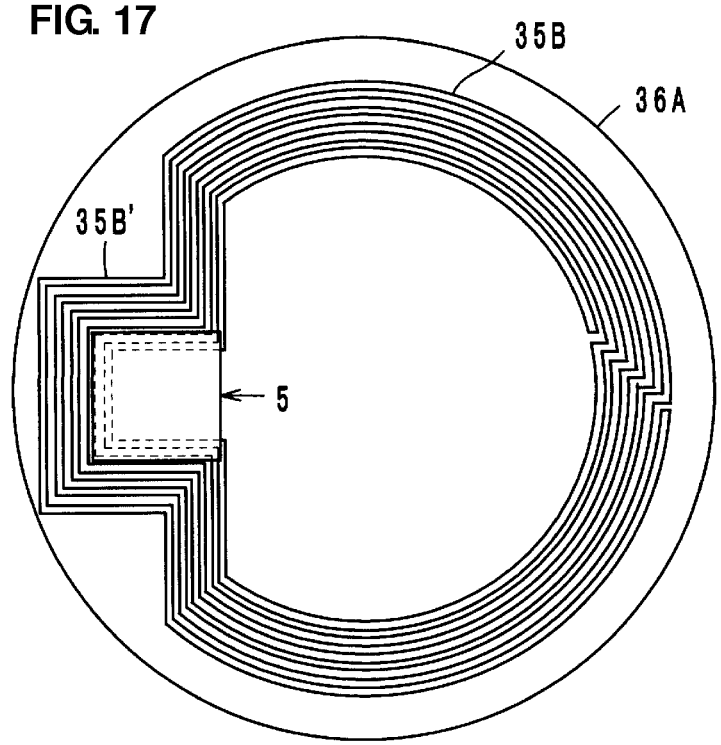
FIG. 17 is a diagram illustrating a third example of an antenna pattern on a surface according to a preferred embodiment of the present invention.

FIG. 17 illustrates an antenna pattern 35B that is the third example of a preferred embodiment of the present invention. Preferably, the antenna pattern 35B includes a square portion 35B', has a substantially circular shape, and is provided on the upper surface and the lower surface of the base substrate 36A so that the antenna pattern 35B on the lower surface overlaps the antenna pattern 35B on the upper surface in plan view. The antenna pattern 35B on the upper surface and the antenna pattern 35B on the lower surface are capacitively coupled to each other, and an equivalent circuit defined by the antenna patterns 35B is preferably the same or substantially the same as that illustrated in FIG. 16.

The feeding circuit board 15 is disposed along the inner circumference of the square portion 35B' on the upper surface of the base substrate 36A, and the coil electrode 20 in the feeding circuit board 15 is magnetically coupled to the antenna pattern 35B. As a result, a radio communication device is provided. The operational effects and advantages of the antenna pattern 35B are the same or substantially the same as the above-described operational effects and advantages of the antenna pattern 35A. In particular, the antenna pattern 35B is coupled to the coil electrode 20 with three sides thereof, and the amount of coupling between the antenna pattern 35B and the coil electrode 20 is therefore increased.

Fourth Example of Antenna Pattern

Figure 18:
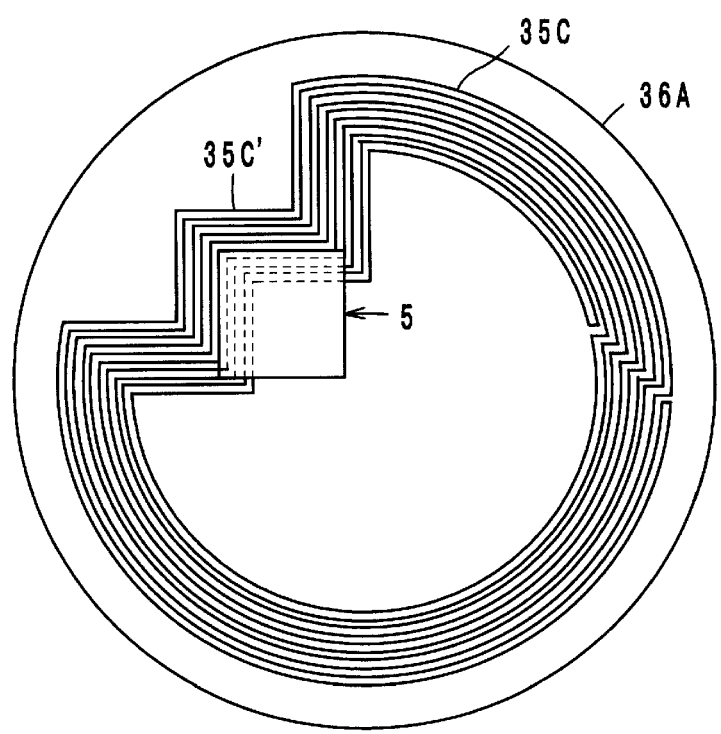
FIG. 18 is a diagram illustrating a fourth example of an antenna pattern on a surface according to a preferred embodiment of the present invention.

FIG. 18 illustrates an antenna pattern 35C that is the fourth example of a preferred embodiment of the present invention. Preferably, the antenna pattern 35C includes a step portion 35C', has a substantially circular shape, and is provided on the upper surface and the lower surface of the base substrate 36A so that the antenna pattern 35C on the lower surface overlaps the antenna pattern 35C on the upper surface in plan view. The antenna pattern 35C on the upper surface and the antenna pattern 35C on the lower surface are capacitively coupled to each other, and an equivalent circuit formed by the antenna patterns 35C is preferably the same or substantially the same as that illustrated in FIG. 16.

The feeding circuit board 15 is disposed along the inner circumference of the step portion 35C' on the upper surface of the base substrate 36A, and the coil electrode 20 is electromagnetically coupled to the antenna pattern 35C. As a result, a radio communication device is provided. The operational effects and advantages of the antenna pattern 35C are the same or substantially the same as the above-described operational effects and advantages of the antenna pattern 35A. In particular, the antenna pattern 35C is coupled to the coil electrode 20 with two sides thereof, and the amount of coupling between the antenna pattern 35C and the coil electrode 20 is therefore increased.

Fifth Example of Antenna Pattern

Figure 19A:
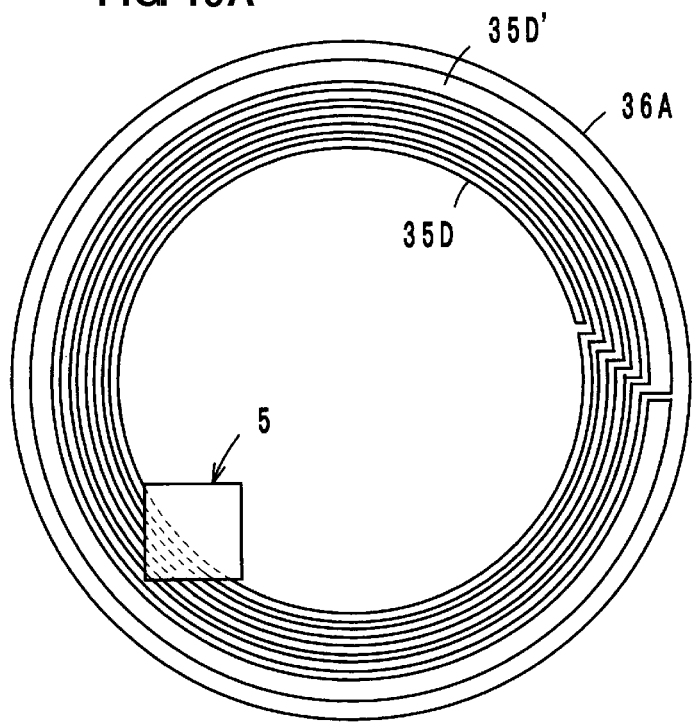
FIGS. 19A and 19B are diagrams illustrating a fifth example of an antenna pattern on a surface according to a preferred embodiment of the present invention.
Figure 19B:
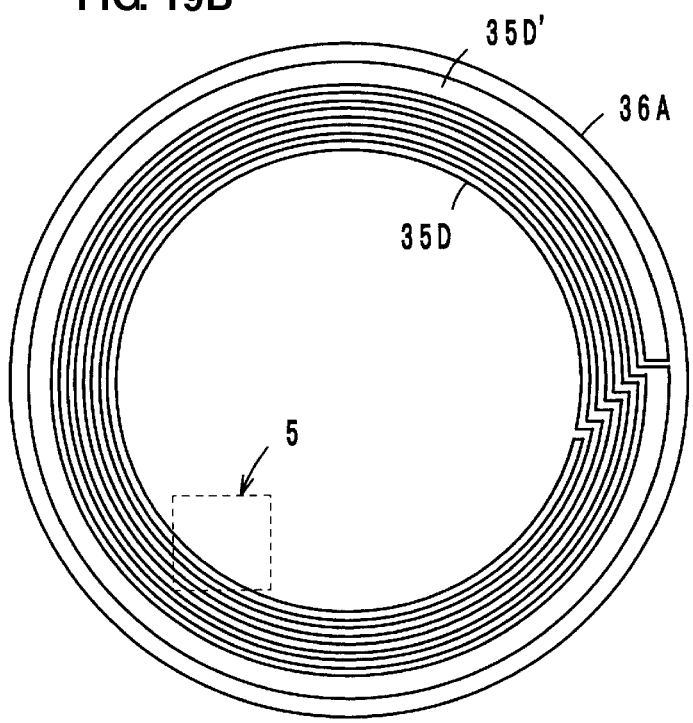

FIGS. 19A and 19B illustrate an antenna pattern 35D that is the fifth example of a preferred embodiment of the present invention. The shape of the antenna pattern 35D is substantially the same as that of the antenna pattern 35A illustrated in FIG. 15 except that the width of the outermost turn portion 35D' is greater than that of the other turn portions. The structure and operational effects and advantages of the antenna pattern 35D are substantially the same as those of the antenna pattern 35A. Since a combined capacitance is greater at the outermost turn portion 35D', the resonant frequency of the antenna pattern 35D can be reduced. It is therefore possible to increase a magnetic flux pass region without reducing the diameter of the opening of the antenna pattern 35D. That is, it is possible to shift the resonant frequency of the antenna pattern 35D to a lower-frequency side and maintain or improve a communication range without enlarging the overall size of the antenna pattern 35D.

Sixth Example of Antenna Pattern

Figure 20A:
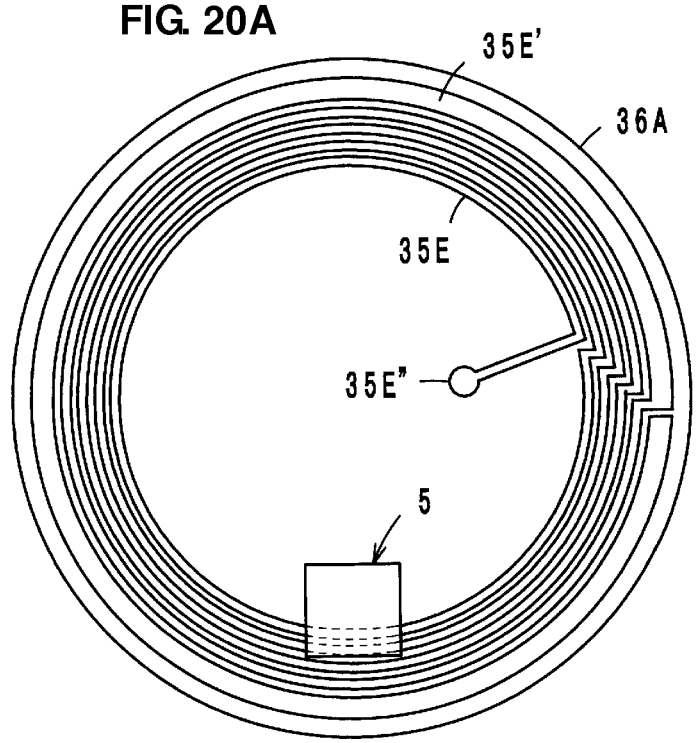
FIGS. 20A and 20B are diagrams illustrating a sixth example of an antenna pattern on a surface according to a preferred embodiment of the present invention.
Figure 20B:
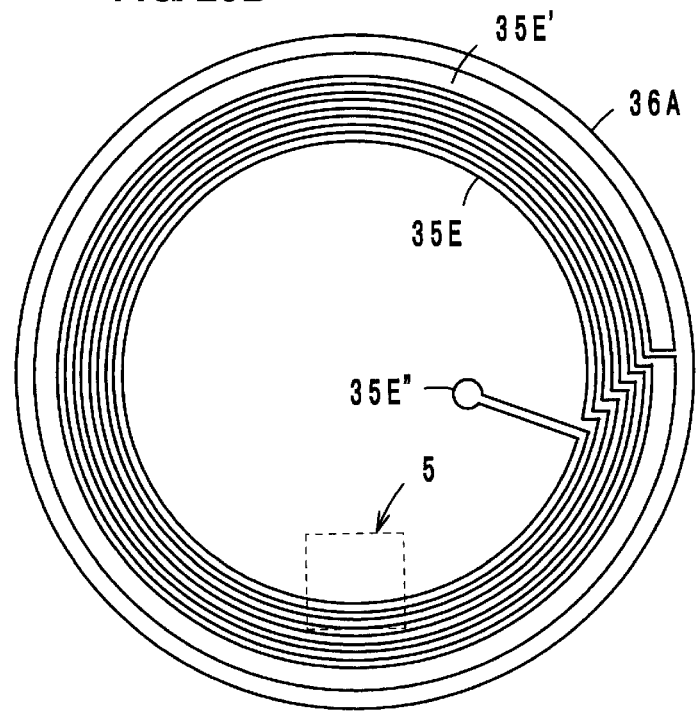
Figure 21:
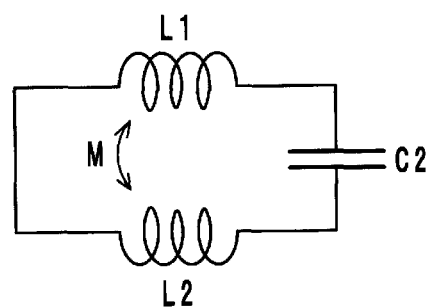
FIG. 21 is an equivalent circuit diagram of the sixth example of an antenna pattern according to a preferred embodiment of the present invention.

FIGS. 20A and 20B illustrate an antenna pattern 35E that is the sixth example of a preferred embodiment of the present invention. Similar to the antenna pattern 35D illustrated in FIGS. 19A and 19B, the antenna pattern 35E includes an outermost turn portion 35E' having a wide width. One ends 35E" of the antenna patterns 35E disposed on the upper surface and the lower surface of the base substrate 36A are preferably DC-connected to each other by crimping, for example. The antenna patterns 35E define an equivalent circuit illustrated in FIG. 21 in which the inductor L1 defined by the antenna pattern 35E on the upper surface and the inductor L2 defined by the antenna pattern 35E on the lower surface are magnetically (M) coupled to each other, the ends 35E" are DC-connected to each other, and the outermost turn portions 35' are coupled to each other via the capacitor C2.

The effects and advantages of the antenna patterns 35E that are magnetically coupled to each other are similar to those of the antenna patterns 35A illustrated in FIGS. 15A and 15B. In particular, since a coupling capacitance is greater at the outermost turn portion 35E' in the antenna pattern 35E as in the antenna pattern 35D, the resonant frequency of the antenna pattern 35E can be reduced. It is therefore possible to increase a magnetic flux pass region without reducing the diameter of the opening of the antenna pattern 35E. That is, it is possible to shift the resonant frequency of the antenna pattern 35E to a lower-frequency side and maintain or improve a communication range without enlarging the entire size of the antenna pattern 35E.

IC Card

Figure 22:
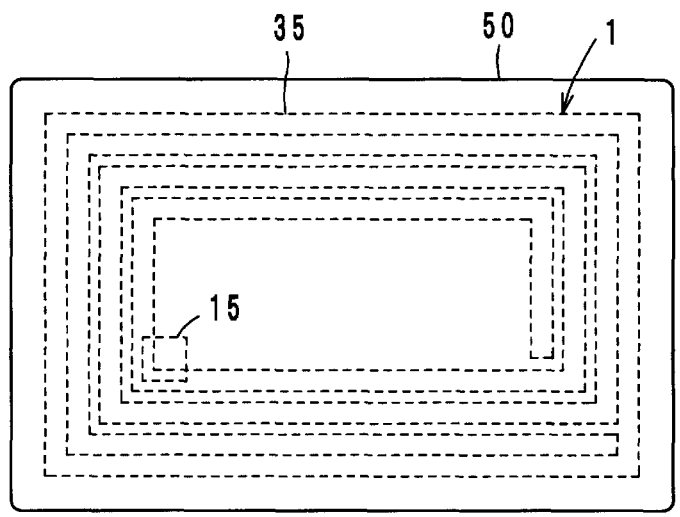
FIG. 22 is a plan view of an IC card that is an example of a radio communication terminal according to a preferred embodiment of the present invention.

FIG. 22 illustrates an IC card 50 as an example of a radio communication terminal according to a preferred embodiment of the present invention. The IC card 50 includes the radio communication device 1.

A radio communication device according to the present invention and a radio communication terminal according to the present invention are not limited to the above-described preferred embodiments, and various changes may be made to the preferred embodiments without departing from the scope of the present invention.

For example, in the above-described preferred embodiments, a loop electrode includes coil patterns each having a predetermined winding width corresponding to a plurality of turns. Each coil pattern may have a predetermined winding width corresponding to only one turn. Instead of the coil patterns including multiple layers, a coil pattern including a single layer may be used.

Furthermore, instead of a radio frequency IC chip mounted on a feeding circuit board, a radio frequency IC integrated into a feeding circuit board may be used. A radio frequency IC may be mounted on another substrate near the feeding circuit board as a chip. A radio communication device may be included in various mobile apparatuses other than the IC card.

The radio frequency IC chip and the loop electrode do not have to be DC-connected (i.e., directly connected) to each other, and may be electromagnetically coupled to each other.

An antenna pattern may have various shapes as long as it functions as an antenna. Preferred embodiments of the present invention can be applied not only to a radio communication device for an HF band, such as the 13.56 MHz band, for example, but also to radio communication devices for a UHF band and an SHF band.

As described previously, preferred embodiments of the present invention are useful for a radio communication device and a radio communication terminal, and have an advantage of achieving the coupling between a loop electrode in a feeding circuit board and an antenna pattern and efficient signal transmission.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A radio communication device comprising:
a radio frequency IC configured to process a radio signal;
a feeding circuit connected to the radio frequency IC and including a loop electrode including a coil pattern with a predetermined winding width; and
an antenna pattern magnetically coupled to the loop electrode; wherein the feeding circuit is arranged so that, in plan view as seen from a coil axis direction of the coil pattern, a first region of the loop electrode in which the coil pattern extends in a first direction overlaps the antenna pattern and a second region of the loop electrode in which the coil pattern extends in a second direction opposite to the first direction does not overlap the antenna pattern;

the first direction and a line length direction of the antenna pattern are the same or substantially the same; and no radio frequency IC is directly connected or coupled to the antenna pattern.

2. The radio communication device according to claim 1, wherein the coil pattern includes a plurality of winding turns in a common plane within the predetermined winding width.

3. The radio communication device according to claim 1, wherein
the feeding circuit includes a feeder circuit board which is a multilayer substrate including a plurality of layers; and
the coil pattern includes a plurality of coil patterns provided on at least two of a plurality of layers and the plurality of coil patterns on the at least two of the plurality of layers are connected via interlayer conductors.

4. The radio communication device according to claim 1, wherein the coil pattern of the feeding circuit is arranged so that, in plan view as seen from the coil axis direction, the first region overlaps the antenna pattern throughout a width of the first region.

5. The radio communication device according to claim 4, wherein a line width of the antenna pattern is greater than the predetermined winding width of the coil pattern.

6. The radio communication device according to claim 1, wherein the coil pattern of the feeding circuit is arranged so that, in plan view as seen from the coil axis direction, an opening of the coil pattern does not overlap the antenna pattern.

7. The radio communication device according to claim 1, wherein the loop electrode has a rectangular or substantially rectangular shape in plan view as seen from the coil axis direction.

8. The radio communication device according to claim 1, wherein the antenna pattern includes a plurality of winding turns in a common plane and has a coil shape.

9. The radio communication device according to claim 8, wherein the coil pattern of the feeding circuit is arranged so that, in plan view as seen from the coil axis direction, a width of the first region does not straddle each of the plurality of winding turns of the antenna pattern.

10. The radio communication device according to claim 8, wherein the feeding circuit is arranged so that the coil pattern of the feeding circuit faces a corner of the antenna pattern, and adjacent two sides of the loop electrode overlap the antenna pattern in plan view as seen from the coil axis direction.

11. A radio communication terminal comprising a radio communication device including:
a radio frequency IC configured to process a radio signal;
a feeding circuit connected to the radio frequency IC and including a loop electrode including a coil pattern with a predetermined winding width; and
an antenna pattern magnetically coupled to the loop electrode; wherein
the feeding circuit is arranged so that, in plan view from a coil axis direction of the coil pattern, a first region of the loop electrode in which the coil pattern extends in a first direction overlaps the antenna pattern and a second region of the loop electrode in which the coil pattern extends in a second direction opposite to the first direction does not overlap the antenna pattern;

the first direction and a line length direction of the antenna pattern are the same or substantially the same; and no radio frequency IC is directly connected or coupled to the antenna pattern.

12. The radio communication terminal according to claim 11, wherein the coil pattern includes a plurality of winding turns in a common plane within the predetermined winding width.

13. The radio communication terminal according to claim 11, wherein
the feeding circuit includes a feeder circuit board which is a multilayer substrate including a plurality of layers; and
the coil pattern includes a plurality of coil patterns provided on at least two of a plurality of layers and the plurality of coil patterns on the at least two of the plurality of layers are connected via interlayer conductors.

14. The radio communication terminal according to claim 11, wherein the coil pattern of the feeding circuit is arranged so that, in plan view as seen from the coil axis direction, the first region overlaps the antenna pattern throughout a width of the first region.

15. The radio communication terminal according to claim 14, wherein a line width of the antenna pattern is greater than the predetermined winding width of the coil pattern.

16. The radio communication terminal according to claim 11, wherein the coil pattern of the feeding circuit is arranged so that, in plan view as seen from the coil axis direction, an opening of the coil pattern does not overlap the antenna pattern.

17. The radio communication terminal according to claim 11, wherein the loop electrode has a rectangular or substantially rectangular shape in plan view as seen from the coil axis direction.

18. The radio communication terminal according to claim 11, wherein the antenna pattern includes a plurality of winding turns in a common plane and has a coil shape.

19. The radio communication terminal according to claim 18, wherein the coil pattern of the feeding circuit is arranged so that, in plan view as seen from the coil axis direction, a width of the first region does not straddle each of the plurality of winding turns of the antenna pattern.

20. The radio communication terminal according to claim 18, wherein the feeding circuit is arranged so that the coil pattern of the feeding circuit faces a corner of the antenna pattern, and adjacent two sides of the loop electrode overlap the antenna pattern in plan view as seen from the coil axis direction.

* * * * *